(12) United States Patent
Garber et al.

(10) Patent No.: US 7,391,024 B2
(45) Date of Patent: *Jun. 24, 2008

(54) STEADY-STATE NON-EQUILIBRIUM DISTRIBUTION OF FREE CARRIERS AND PHOTON ENERGY UP-CONVERSION USING SAME

(75) Inventors: Valery Garber, Yokneam Elite (IL); Emanuel Baskin, Haifa (IL); Alexander Epstein, Haifa (IL); Alexander Fayer, Herzlia (IL); Boris Spektor, Haifa (IL)

(73) Assignee: Sirica Corporation, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/703,250

(22) Filed: Feb. 7, 2007

(65) Prior Publication Data

US 2007/0138391 A1    Jun. 21, 2007

Related U.S. Application Data

(62) Division of application No. 11/152,399, filed on Jun. 15, 2005, now Pat. No. 7,193,210, which is a division of application No. 10/864,392, filed on Jun. 10, 2004, now Pat. No. 6,995,371.

(60) Provisional application No. 60/477,752, filed on Jun. 12, 2003.

(51) Int. Cl.
*H01L 31/00* (2006.01)
(52) U.S. Cl. .................. 250/330; 359/326; 136/255
(58) Field of Classification Search .................. 250/330
See application file for complete search history.

(56) References Cited

U.S. PATENT DOCUMENTS

| 5,195,104 | A | 3/1993 | Geiger et al. |
| 5,482,570 | A | 1/1996 | Saurer et al. |
| 5,935,345 | A | 8/1999 | Kuznicki |
| 6,402,037 | B1 | 6/2002 | Prasad et al. |
| 6,654,161 | B2 | 11/2003 | Bass et al. |
| 6,861,722 | B2 | 3/2005 | Graetzel et al. |
| 6,995,371 | B2 * | 2/2006 | Garber et al. ............ 250/330 |
| 7,193,210 | B2 * | 3/2007 | Garber et al. ............ 250/330 |
| 2002/0162995 | A1 | 11/2002 | Petroff et al. |

OTHER PUBLICATIONS

Vogel et al., Quantum sized PbS, CsS, Ag2S, Sb2S3, and Bi2S3 Particles as Sensitizers for Various Nanoporous Wide-Bandgap . . . , 1994, J: Phys. Chem., vol. 98, pp. 3183-3188.

U. Efron et al., Liquid-crystal based visible-to-infrared dynamic image converter; Optical Engineering; Jan./Feb. 1985; vol. 24, No. 1; pp. 111-118.

(Continued)

*Primary Examiner*—Christine Sung
(74) *Attorney, Agent, or Firm*—Volentine & Whitt, PLLC

(57) ABSTRACT

An apparatus is disclosed for the conversion of radiation. The apparatus includes a mesoscopic sized region, an interface surrounding the mesoscopic sized region and contacting the mesoscopic region to form an energetic barrier sufficient to spatially confine free carriers in the mesoscopic sized region, and a matrix material surrounding the interface. At least one of the interface and the matrix material provides radiative recombination of the free carriers.

14 Claims, 14 Drawing Sheets

OTHER PUBLICATIONS

J. Grinberg et al.; Visible-to-Infrared Image Converter for Dynamic Infrared Target Stimulation Applications; SPIE; vol. 226; 1980; pp. 129-132.

T. Schimert et al.; Low Cost, Low Power Uncooled a-Si-Based Micro Infrared Camera for Unattended Ground Sensor Applications; SPIE; Apr. 1999; vol. 3713; pg. 101-111.

Tomohiro Ishikawa et al.; Low-cost 320×240 Uncooled IRFPA Using Coventional Silicon IC Process; SPIE; vol. 3698; Apr. 1999; pp. 556-564.

J. Brady et al.; Advances in Amorphous Silicon Uncooled IR Systems; SPIE; Apr. 1999; vol. 3698; pp. 161-167.

W. Eisfeld et al.; Infrared to Visible Up-Conversion Using GaP Light-Emitting Diodes; American Institute of Physics; Feb. 1, 1983; pp. 276-278.

Christopher D. Brewer et al.; Space-bandwidth Produce Enhancement of a Monostatic, . . . etc.; Applied Optics; Apr. 20, 2002; vol. 41, No. 12; pp. 2251-2262.

H. Willebrand et al.; Spatially and Temporally Resolved IR-Image Detection With A Semiconductor-gas-discharge Device; SPIE; 1194; vol. 2269; pp.688-697.

Guang S. He et al.; Observation of Stimulated Emission By Direct Three-photon Excitation; Nature; Feb. 14, 2002, vol. 415, pp. 767-770.

R. Winn Hardin; IR Detector Industry Sets Sights on Monolithic, Multicolor IR Detectors; IR Detector Industry Sets Sights; Apr. 1999; No. 184.

George J. Yates et al.; Range-gated Ladar Coherent Imaging Using Parametic Up-Conversion of IR . . . ; SPIE; 2001; vol. 4308; pp. 19-27.

Kamala S. Krishnan et al.; Infrared Imaging Using Nonlinear Optical Unconversion; SPIE; vol. 122; pp. 100-108.

David J. Lockwood; Light Emission in Silicon; Semiconductors and Semimetals; vol. 49; pp. 1-33.

Tsutomu Shimizu-Iwayama et al.; Visible Photoluminescence Related to Si Precipitates in Si+ -Implanted $SiO_2$; Matter 5; 1993; pp. 375-380.

F. Koch et al.; Some Perspectives on the Luminescence Mechanism Via Surface-Confined States of Porous SI; Materials Research Society; vol. 283; pp. 197-202.

Christy L. Haynes et al.; Nanosphere Lithography; Synthesis and Application of Nanoparticles with Inherently, Anisotropic Structures and Surface Chemistry; Dept. of Chemistry.

H.S. Chen et al.; On the Photoluminescence of Si Nanoparticles; Materials Physics Mech. 4; 2001.

Qi Zhang et al.; Blue Photoluminescence and Local Structure of Si Nanostructures embedded in $SiO_2$ Matrices; Appl. Phys. Lett. 66; Apr. 10, 1995.

Jianhong Zhu et al.; Growth of High Density Si Nanoparticles on $Si_3N_4$ and $SiO_2$ Thin . . . ; Journal of Applied Physics; Oct. 15, 2002; vol. 92, No. 8; pp. 4695-4698.

L. Pavesi et al.; Optical Gain in Silicon Nanocrystals; Nature; Nov. 23, 2000; vol. 408; pp. 440-444.

S. Charvet et al.; Ellipsometric Spectroscopy Study of Photoluminescent $Si/SiO_2$ Systems Obtained by Magnetron Co-Sputtering; Journal of Luminescence; 1999; pp. 257-261.

* cited by examiner

STEADY-STATE NON-EQUILIBRIUM DISTRIBUTION OF FREE CARRIERS AND PHOTON ENERGY UP-CONVERSION USING SAME

This application is a divisional application of U.S. patent application Ser. No. 11/152,399 filed Jun. 15, 2005 now U.S. Pat. No. 7,193,210 which is a divisional application of U.S. application Ser. No. 10/864,392 filed Jun. 10, 2004 (now issued as U.S. Pat. No. 6,995,371), which claims the benefit of U.S. Provisional Application No. 60/477,752 filed Jun. 12, 2003.

BACKGROUND OF THE INVENTION

1. Field of the Invention

The present invention provides specialized media and related methods whereby a photo-induced, Steady-State, Non-Equilibrium Electron Distribution ("SNED") of free carriers is developed using Mesoscopic Classical Confinement ("MCC"). The photo-induced SNED of free carriers using MCC finds application across a broad range of technical fields, including as examples, infrared (IR) radiation detection and related imaging systems, light modulation, optical switching, wave-division multiplexing, optical amplifiers, lasers, data memories, and color displays.

2. Description of the Related Art

Advances in materials science have greatly enhanced our ability in recent years to engineer man-made materials with specific physical properties by creating different structural composites of useful materials such as semiconductor and dielectrics. Within the broad class of semiconductor materials, silicon underpins nearly all-contemporary microelectronics and will continue to do so for the foreseeable future. However, the indirect band-gap nature of silicon greatly limits its usefulness in applications like optoelectronic and photonic devices. Such applications continue to be dominated by direct band-gap materials such as Gallium-Arsenide (GaAs). As a result, the merger of silicon-based electronics with non-silicon-based photonics has largely required the development of hybrid technologies that are often expensive and complicated to produce.

A myriad of commercial applications continues to drive materials scientists in their pursuit of "silicon based" optoelectronic devices. Desirable all-silicon components include, as examples, lasers and other light emitters, modulators, and photodetectors. These components have application in numerous fields, including infrared imaging.

Infrared imaging is the remote sensing and subsequent display of energy existing in a specific portion of the electromagnetic spectrum. Variations in the displayed image intensity represent apparent temperature variations across an image field. The detected radiation appears to emanate from a target surface, but it actually consists of self-emission, reflected radiation, and atmospheric path radiance. To distinguish a target from its background, the detected radiation must be differentiated from the background radiance.

Practical single element infrared detectors were developed during World War II using a lead salt compound (PbS). The basic technical approach, while much refined, is still in use today.

Since at least the 1970's, the promise of IR imaging has resulted in an intense expenditure of resources to improve IR detection capabilities (i.e., create IR photodetectors having improved detectivity and response time). Applications for IR imaging systems include both military and commercial. Military applications include target acquisition, fire control, reconnaissance, and navigation, among others. Commercial applications extend across a broad reach of fields including civil, environmental, industrial, and medical.

A conventional infrared imaging system typically consists of multiple subsystems. FIG. 1 illustrates a number of these subsystems. IR emitted from a target surface is collected by one or more lenses in an optics subsystem. A mechanical scanner assembly is sometimes incorporated with the optics subsystem to move a detector's instantaneous-field-of-view across an imaging field-of-view. In a scanning system, the output of a single detector may be used to develop an imaged scene's intensity using a rasterized scan line in much the same manner as commercial television. With a staring focal plane array (FPA) there is no scanner and the output of individual detectors in the array provides scene variations. Optical filters associated with the optics subsystem are often used to selectively pass or block certain wavelengths of light.

The photodetector is the heart of every infrared imaging system, because it converts scene radiation into a measurable (or displayable) output signal. Conventionally, amplification and signal processing create an electronic image in which voltage differences represent IR radiation intensity differences resulting from objects in the field-of-view.

Each detector in a staring array or scanning detector based system normally has its own amplifier. Amplifier outputs are multiplexed together and then digitized. The number of channels multiplexed together depends upon the specific system design. However, conventional systems typically have several multiplexers and analog-to-digital (A/D) converters operating in parallel.

Signals are typically digitized because it is relatively easy to manipulate and store digital data. Conventional infrared imaging systems rely heavily on software for gain/level normalization, image enhancement, and scan line interpolation. All of these post-detection, electronic circuits are generalized in FIG. 1. Following amplification, digitization, image reconstruction, and post reconstruction processing, an output signal corresponding to the detected IR image is communicated to control, monitoring, measurement, and/or display apparatus.

The word infrared (along with its abbreviation "IR") has been given different meanings in accordance with a number of conventional applications. For example, so-called infrared film is commonly sensitive out to wavelengths of about 0.85 µm. Spectral responses to wavelengths greater than 0.7 µm often result in systems being generally labeled "infrared." Indeed, the term infrared has been used to describe one or more portions of the electromagnetic spectrum ranging from 0.7 µm to 1.0 mm.

In the context of the present invention, the terms infrared and IR are interchangeably used to broadly describe system responses, radiation signals, and/or portions of the electromagnetic spectrum ranging from the near-infrared range beginning at 0.7 µm up through the extreme-infrared range ending about 100 µm. The terms infrared and IR specifically include at least the mid-wavelength infrared (MWIR) band of 2.0 to 7.0 µm and the long-wavelength infrared (LWIR) band of 7.0 to 15.0 µm. Of particular note, the MWIR band contains a first thermal imaging band including wavelengths from between 3.0 to 5.5 µm, and the LWIR band contains a second thermal imaging band including wavelengths from between 8.0 and 14.0 µm. These two thermal imaging bands relate one-for-one with well-understood atmospheric transmission windows that advantageously allow efficient propagation of IR radiation. Most conventional IR applications rely on the detection of IR wavelengths within one or both of these two imaging bands.

Indeed, most conventional IR imaging systems are locked into either the first or the second thermal imaging band by a predetermination of one or more IR wavelengths to be detected. For example, Hg1-xCdxTe (x=0.2) quantum detectors, sodium metal vapor devices, and ZnGeP2 or Ag3AsS3 nonlinear crystal based systems detect IR wavelengths in the second thermal imaging band. In contrast, InSb photodetectors, quantum counters (CW and pulsed), cesium metal vapor detectors, and LiNbO3 nonlinear crystal based systems detect IR wavelengths in the first thermal imaging band. Being locked into either the first or the second thermal imaging band is a significant performance limitation attributable to conventional IR imaging system, regardless of the actual technology enabling IR detection. Multi-color capabilities are highly desirable for advance IR systems. Systems that gather data in separate IR spectral bands can discriminate both absolute temperature and unique signatures of objects in the scene. Multi-band detection also enables advanced color processing algorithms to further improve sensitivity above that of single color devices.

Currently, multi-spectral systems rely on cumbersome imaging techniques that either disperse the optical signal across multiple IR FPAs or use a filter wheel to spectrally discriminate the image focused on a single FPA. Consequently, these approaches are expensive in terms of size, complexity, and cooling requirements.

Infrared imaging systems do not actually sense warmth or cold like a thermometer. Rather, such systems sense electromagnetic radiation in a pre-defined band of interest. The relative breadth or narrowness of this detection band is an important imaging system characteristic.

In its broadest context, a photodetector or photosensor is any device that "converts" incident radiation in a detection band into a measurable or displayable electrical signal. The photo-detection process can be defined as generally comprising two steps: (1) the absorption of incident infrared light to cause a corresponding change in some device parameter (e.g., conductivity, charge capacitance, voltage, temperature, etc.); and (2) translation of the changed parameter into some measurable value (e.g., voltage, current, etc.). Progress in IR detector technology is connected mainly to semiconductor IR detectors, which are included in the class of photon detectors. In this class of detectors the radiation is absorbed within the material by interaction with electrons. The observed electrical output signal results from the changed electronic energy distribution. The photon detectors show a selective wavelength dependence of the response per unit incident radiation power. They exhibit both perfect signal-to-noise performance and a very fast response. But to achieve this, the photon detectors require cryogenic cooling. Cooling requirements are the main obstacle to the more widespread use of IR systems based on semiconductor photodetectors making them bulky, heavy, expensive and inconvenient to use. Depending on the nature of interaction, the class of photon detectors is further sub-divided into different types. The most important are: intrinsic detectors, extrinsic detectors, photo-emissive (metal silicide Schottky barriers) detectors, and quantum well detectors.

The second class of IR detectors is composed of thermal detectors. In a thermal detector the incident radiation is absorbed to change temperature of the material, and the resultant change in some physical properties is used to generate an electrical output. The detector element is suspended on lags, which are connected to the heat sink. Thermal effects are generally wavelength independent; the signal depends upon the radiant power (or its rate of change) but not upon its spectral content. In pyroelectric detectors a change in the internal spontaneous polarization is measured, whereas in the case of bolometers a change in the electrical resistance is measured. In contrast to photon detectors, the thermal detectors typically operate at room temperature. They are usually characterized by modest sensitivity and slow response but they are cheap and easy to use. The greatest utility in IR technology has found bolometers, pyroelectric detectors and thermopiles. Up till the nineties, thermal detectors have been considerably less exploited in commercial and military systems in comparison with photon detectors. The reason for this disparity is that thermal detectors are popularly believed to be rather slow and insensitive in comparison with photon detectors. As a result, the worldwide effort to develop thermal detectors was extremely small relative to that of photon detector. In the last decade however, it has been shown that extremely good imagery can be obtained from large thermal detector arrays operating un-cooled at TV frame rates. The speed of thermal detectors is quite adequate for non-scanned imagers with two-dimensional (2D) detectors. The moderate sensitivity of thermal detectors can be compensated by a large number of elements in 2D electronically scanned arrays.

While manufacturing and operational tradeoffs exist between specific technologies implementing thermal IR detectors, they generally share a common set of positive characteristics:

operation at room temperature, such that no sophisticated, external cooling system is required;

large format feasibility that allows improved detection sensitivity;

relatively low power consumption and ease of maintenance;

a lightweight, compact nature;

high manufacturability (i.e., high yields) using conventional silicon and/or integrated circuit materials and using conventional processing techniques; and low cost.

The final benefit listed above is probably the most notable. The low cost nature of thermal IR detectors explains their prevalence in low-end commercial applications. That is, conventional thermal IR detectors are relatively simple to manufacture and operate, and are, therefore, well suited to low-end and mid-range applications where cost considerations dominate performance considerations.

This reality is clearly manifest upon consideration of a list of common disadvantages associated with thermal IR detectors, including:

low detectivity (i.e., limited identification range);

low spatial resolution;

slow response time;

low sensitivity, requiring elaborate calibration and costly corrective electronics;

a requirement for vacuum packaging for heat isolation; and, a frequent additional requirement for some form of thermo-electric cooling to stabilize temperature.

The contrast between thermal IR detectors and photon (or quantum) IR detectors is striking. Conventional implementations for photon detectors include, as examples: silicide Schottky-barrier devices (platinum silicide); InSb (Indium antimonide); HgCdTe (mercury cadmium telluride or MCT); band-gap engineered inter-subband photodetectors: gallium arsenide (GaAs)-based quantum well infrared photodetectors (QWIP), InSb/InAs type II supper-lattices and, quantum dot infrared photodetectors (QDIP).

Each of these technologies yields a photon IR detector exhibiting an output signal related to a number of absorbed photons, as opposed to the actual energy of the photons.

Generally, an electrical current is produced in relation to electron/hole transitions between energy states brought about by the process of photon absorption. Hereafter, all IR detectors outputting a signal varying in relation to a number of absorbed photons will be denominated as "photon (or quantum) IR detectors."

Again, while manufacturing and operational tradeoffs exist between specific technologies implementing photon IR detectors, they generally share the following set of positive characteristics, including:
  high spatial and thermal resolutions;
  high detectivity, thus enabling long identification ranges;
  fast response time; and,
  detection of polarized light, thereby allowing distinction between natural objects in the background and man-made objects.

Not surprisingly, conventional photon IR detectors dominate high-end commercial and military applications. That is, conventional photon IR detectors provide superior performance and, thus, dominate high-end applications where performance considerations dominate cost considerations.

Disadvantages generally associated with photon IR detectors include:
  uniformity issues caused by the required combination of exotic materials;
  difficult manufacturing processes including many steps and low device yields;
  materials and processing incompatibility with current silicon processing techniques;
  a cooling requirement, usually to cryogenic temperatures;
  difficult maintenance issues and high power consumption; and,
  high cost.

Many of the disadvantages associated with conventional photon IR detectors are notable. Indeed, these disadvantages have thus far largely overwhelmed the remarkable detection performance offered by photon IR detectors in all but the highest-end and most costly applications.

Large format arrays are most difficult to obtain given the low yields and the often non-uniform nature of the individual photon detectors. The exotic composition materials require custom fabrication lines and highly specialized processing techniques. This lack of compatibility with the mature field of silicon-based semiconductor manufacturing, together with the enormous burden (financial, maintenance, and technical) of a providing a sophisticated, external cooling system lead to the implementation of very expensive and often bulky IR detection systems.

From the exemplary lists of enabling technologies noted above, it is clear that great efforts have been made to identify high performance IR detectors that may be implemented at a reasonable price. Recently, great improvements have been made in thermal IR detectors with the development of microbolometers. See, for example, Brady et al., Advances in Amorphous Silicon Un-cooled IR Systems, SPIE Conference on Infrared Technology and Applications XXV, Orlando, Fla., SPIE Vol. 3698, April 1999. However, these devices still suffer from a relatively large element size and slow response speeds. Further, complex MEMS (micro-electromechanical) process techniques are implicated in the fabrication of these devices.

Recent strides have also been made in photon IR detectors with the development of improved QWIP devices that are both IR sensitive and manufacturable at relatively low cost. QWIP devices detect wavelengths that extend into the far-infrared, greatly expanding the IR detection range. In addition, QWIP devices offer new functionality features, such as polarization-sensitive detection. Yet, these devices must operate at temperatures significantly less than 80° K. to reduce the dark current in order to achieve optimal performance. Low operation temperature is a fundamental limitation for QWIPs based on type III-V semiconductor materials. This is due to the high strength of the longitudinal optical phonons within these materials, which results in a very strong thermal excitation of the electrons. Therefore, such structures are characterized by large dark current and noise. An additional drawback of QWIPs lies in the fact that they cannot detect normally incident light because of the 'quantum mechanical polarization rule' that requires an electric field component perpendicular to the layer planes of the quantum well structure. This polarization rule can be met by illuminating the structure via 45° facets—a feasible solution for single-element detectors or linear arrays only. Another method for satisfying the polarization rule is to use diffraction gratings, which are of practical importance in the case of two-dimensional detector arrays. Consequently, QWIPs have low quantum efficiency and require a long integration time for signals to achieve appropriate detectivity.

Recently developed QDIPs offer a number of advantages, including lower dark currents and an inherent sensitivity to normally incident light. QDIPs also operate at higher temperatures. However, growth techniques for quantum dot structures are still in an early research and development state and quantum dot technology is far from maturity. Problems relating to the control of dot density, size, and shape uniformity, as well as process stability and repeatability, still pose serious challenges. All relative promise notwithstanding, QDIPs, like QWIPs, only respond to a single radiation wavelength, or to a narrow spectral band.

Thus, conventional photon IR imaging systems continue to present the basic choice. A low-cost thermal IR imaging system having relatively low performance capabilities would be selected, unless performance requirements are sufficiently high to justify a much costlier imaging system based on photon IR detectors. That is, performance and cost are traded in relation to the anticipated application or budget. Conventional systems are locked into a single thermal imaging band, and very often into a single detection frequency within that band.

This Hobson's choice between performance and cost in the field of IR imaging systems is just one result of the general lack of competent silicon-based optoelectronic devices. Ideally, an all-silicon, un-cooled, photon IR detector would exist and be readily integrated with existing semiconductor electronics. Such an un-cooled, photon IR detector would be capable of detecting a range, or at least a plurality, of IR frequencies. However, silicon-based technologies are widely recognized for their poor performance in optical applications.

The foregoing detailed discussion of conventional IR imaging systems is exemplary of many the unfortunate tradeoffs, deficiencies, and limitations inherent in conventional optical components and electro-optical systems that rely on either low performance, silicon technologies, high-cost specialty materials, or a hybrid of these two general technologies.

Clearly a new and fundamentally different approach is required.

BRIEF SUMMARY OF THE INVENTION

The present invention overcomes the deficiencies that characterize conventional approaches to the detection and processing of optical signals, including for example optical energy up-conversion.

In one embodiment, the present invention provides an apparatus for conversion of radiation comprising; a mesoscopic sized region, an interface surrounding the mesoscopic sized region and contacting the mesoscopic region to form an energetic barrier sufficient to spatially confine free carriers in the mesoscopic sized region, and a matrix material surrounding the interface, wherein at least one of the interface and the matrix material provides radiative recombination of the free carriers.

BRIEF DESCRIPTION OF THE DRAWINGS

The present invention will be understood more fully from the detailed description given below and from the accompanying drawings of selected embodiments of the invention.

Within the drawings.

DESCRIPTION OF EMBODIMENTS

Figure 1:
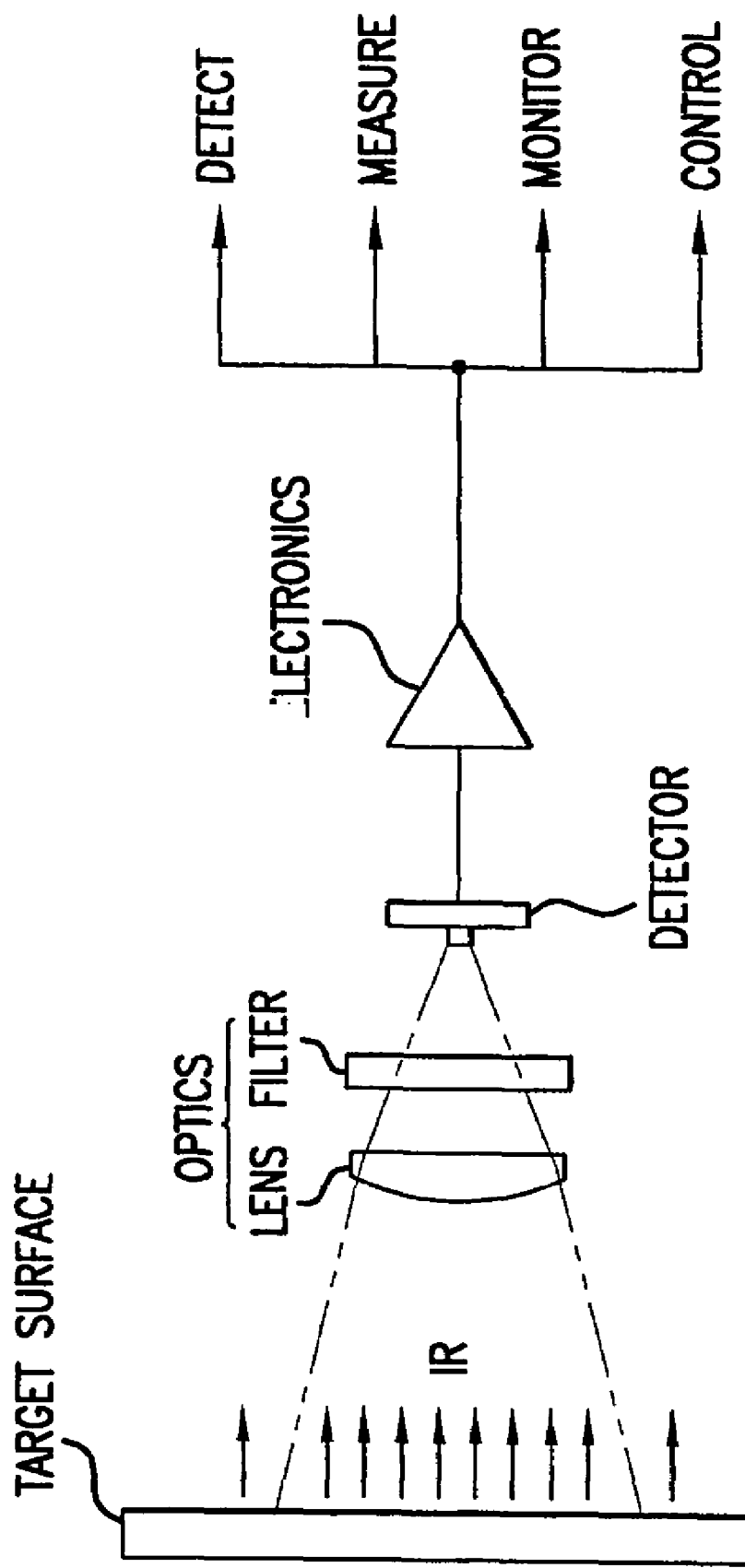
FIG. 1 is a block diagram of a conventional IR imaging system.

Within one exemplary embodiment of the present invention, a Steady-State Non-Equilibrium Distribution ("SNED") of free carriers is created in a specialized media generally referred to hereafter as a "composite structure." Additionally or alternatively, free carriers induced within the composite structure are confined in mesoscopic sized regions that are separated from a surrounding wide-bandgap material by an energetic barrier. The so-called "height" of the energetic barrier is a measurement of the energy required for a free carrier to overcome the barrier and penetrate from a mesoscopic sized region into the surrounding wide-bandgap material. The height is determined by a difference in electron affinities as between the components forming the composite structure and the number of surface states on the boundaries between these components.

"Free carriers" are charged carriers able to move freely through a material, as compared with other carriers bound up within the atomic structure of the material. Free carriers may take the form of electrons, holes, and/or electrons and holes together. For example, in the case of a composite structure formed from crystalline silicon, mesoscopic sized particles embedded with a surrounding layer of hydrogenated amorphous silicon and pumped by an optical energy source, a photo-induced SNED of free holes is formed because the resulting confinement affects holes but not electrons.

Free carriers may be "introduced" (i.e., created or induced) into the mesoscopic sized regions of a competent composite structure using any one of several conventional techniques.

For example, free carriers may be introduced by appropriate doping of the mesoscopic sized regions. Conventionally understood ion implantation or diffusion of selected impurities (i.e., donors and/or acceptors) may be used during the deposition or growth of mesoscopic sized regions. For doping purposes the impurities that create shallow energy levels within the bandgap of the material forming the mesoscopic sized regions are preferably used. The term "shallow" is used to describe the energy levels relatively close to the conductivity/valance band in energetic space. At working temperatures for the composite structure, the associated thermal energy is large enough to result in ionization of the impurity atoms. As a result, there are free carriers in equilibrium with the atoms forming the material lattice of the mesoscopic sized regions within the conductive or valance band(s).

Alternatively, free carriers may be introduced by delta ($\delta$)-doping impurities into material areas are located in close proximity to the mesoscopic sized regions. Delta-doping is a conventionally used technique in the formation of HFET transistors, QWIPs or QDIPs. By delta-doping proximate material areas, free carriers are able to tunnel from (or "fall-off") the impurity atoms into less energetic states within the mesoscopic sized regions. As with the former example, these free carriers are in equilibrium with the atoms forming the material lattice of the mesoscopic sized regions within the conductive or valance band(s).

In another alternative, free carriers are electrically injected into the mesoscopic sized regions. This technique is conventionally used in transistors, light-emitting diodes, and semiconductor lasers. When electrical injection is used free carriers may be non-equilibrium if their energy state is larger than that of the thermal energy state. In bulk materials such high energy free carriers typically dissipate their energy very quickly (e.g., in less than 10-12 seconds) and become equilibrium free carriers. (Dissipation is due to the so-called thermolization process, or the strong interaction between the free carriers and optical phonons). In the contrary in mesoscopic systems due to their specific features will be described later, free carriers are remaining to be high energy for a very long period of time.

In yet another alternative, free carriers may be photo-induced within the mesoscopic sized regions. That is, by means of an optical pumping source free carriers are created as a consequence of photon absorption. In the case of fundamental absorption where photon energy is somewhat larger that the bandgap energy, free electrons are created in the conductive band and free holes are created in the valance band of the mesoscopic sized regions. In the case of extrinsic absorption free carriers may be excited from deep impurity levels. Where photon energy is equal to the bandgap energy (or in the case of extrinsic absorption photon energy is equal to the energy gap between deep levels and correspondent permitted bands) free carriers are the equilibrium carriers and their steady state distribution is a regular Fermi or Boltzman distribution. Where the photon energy is much larger than the bandgap energy of the material forming the mesoscopic sized regions the free carriers are "hot" or strongly non-equilibrium and their distribution may significantly from equilibrium one Of note, the foregoing (and merely exemplary) techniques of introducing free carriers, as conventionally applied to materials, result in broad distributions of free carriers at equilibrium. In contrast, the present invention provides a strongly non-equilibrium distribution of free carriers in the mesoscopic sized regions. Furthermore, the present invention maintains the non-equilibrium distribution over long periods of time (i.e., within a steady-state).

In order to form the desired non-equilibrium distribution (e.g., a very narrow distribution referred to as being "cigarette-like" in shape) the free carriers in the system must have the same or very similar energy states. In one specific embodiment, the present invention tunes the energy state of the free carriers to form the desired distribution by adjusting the optical pumping energy between "kT," where "k" is the Boltzman constant (Joule/K°) and "T" is the absolute temperature (K°) up to the height of an energetic barrier electrically separating the mesoscopic sized regions from the surrounding wide-bandgap material. This arrangement works only where the height of the energetic barrier is less than the impact ionization energy. For the case of silicon, this energy value is about 2.5 eV. In this manner, the present invention engineers a specialty media having optically tunable properties.

Continuing with the example of a photo-induced SNED, development of the desired non-equilibrium distribution of free carriers requires confinement (or localization) of the free carriers within the mesoscopic sized regions. That is, the migration of free carriers within the material forming the mesoscopic sized regions is limited by an appropriate energetic barrier.

In principle, the energetic barrier—that exists on the boundaries separating the constituent components of the composite structure—provides free carrier confinement. As previously noted, the height of the energetic barrier is determined by the relative affinity of electrons to the disparate materials forming the composite structure. For example in a case where semiconductor materials are used to form the composite structure, the energetic barrier arises from an electron band offset, either a valance band offset or a conductive band offset. As is conventionally understood, "electron affinity" is a materials characteristic equal to the measure of energy required to excite an electron from an energy state at the bottom of a conductivity band to a vacuum energy state, such that the electron is freed ("takes-off") from the material.

However, electron affinity may vary for electrons located within a bulk material verses electrons located at the surface (or edge boundary) of the material. The actual magnitude of electron affinity at the surface depends on the quantity and type of surface states at the boundary. Thus, the design of a composite structure to effectively develop the desired free carrier distribution must account for the nature and quality of the energetic barrier existing between the composite structure's constituent components. This energetic barrier is the product of not only the particular materials selected to form the mesoscopic sized regions and the surrounding wide-bandgap material, but also the quality of the interface (the boundary) between these two materials.

In one presently preferred embodiment, the present invention provides crystalline silicon mesoscopic sized regions embedded with a wide bandgap material, such as $SiO_2$, $Si_3N_4$, or amorphous silicon. By selecting a wide bandgap material as the surround matrix material, an effective energetic barrier is developed that inhibits free carrier penetration from the mesoscopic sized regions into the surrounding material. As a result, free carriers will penetrate into the surrounding material only if they overcome the energetic barrier. This can not be done without the application of energy form some source outside the composite structure, such as, for example, IR photon-induced excitation of the free carriers within the context of an infrared detector.

In order to obtain a sufficient quantity of free carriers per each surrounded region within a composite structure and to effect the continuous change in free carriers from one energy state to another, the physical size of the surrounded region becomes a design issue. In the present invention, the size of the surrounded regions may not be "quantum" in nature. Quantum size is one where the diameter of the region is characterized by the same order of electron wavelength. That is, if the region size is quantum, the energy spectrum of electrons will be discrete. Such an energy spectrum largely precludes the necessary continuous change in the energy state of free carriers, since only a very few (e.g., one to perhaps four) energy states exist within the quantum region. The actual number of energy states will depend on the height of the energetic barrier, where the smaller the height the fewer energetic states will exist within the quantum region (or "well").

This set of related requirements must be further considered in the context of Pauli's Exclusion Principle which states that a single energy state (or level) can be occupied simultaneously by no more that two electrons or holes (i.e., fermions) with different spin orientations. Therefore, the size "d" of the surrounded mesoscopic region within a composite structure is defined by the relationship $\lambda_{fc}<d$, (as defined below). This definition ensures that the surrounded regions manifest classical behavior for free carriers distributed across a continuous energy spectrum. With this spatial scale, sufficient and numerous free carriers are available within individual mesoscopic sized regions.

In some additional detail, the mesoscopic spatial scale d is defined by the relationship $\lambda_{fc}<d<l_{e,h}$, where $\lambda_{fc}$ is the free carrier wavelength and $l_{e,h}$ the free carrier's free path. For most practical cases $\lambda_{fc}$ will be less than 10-7 cm and $l_{e,h}$ will be in the order of 10-5 cm. The first condition placed upon d, that of requiring $\lambda_{fc}<d$, characterizes the mesoscopic sized region as a multi-carrier classical dot. The second condition, that of requiring $d<l_{e,h}$, allows a significant reduction of energy transfer between free carriers and the atoms forming the mesoscopic sized region. In other words, the free carriers and the atomic structure of the mesoscopic sized region are thermodynamically uncoupled, or thermally isolated, such that the free carriers and atoms forming the mesoscopic sized region may held at considerably different thermal energy states. Thus, in order to reduce the energy exchange between "hot" free carriers and phonons, and thereby prolonging in a significant way the thermalization time and providing a SNED of free carriers, the diameter of the mesoscopic region should satisfy the condition $d<l_{e,h}$.

Under these conditions, the free carriers can not dissipate their energy by emitting optical phonons. Rather, energy dissipation may only occur when free carriers interact with the material boundary of the mesoscopic sized region, and this process is very inefficient. So, when non-equilibrium free carriers are confined in a mesoscopic sized region having a size diameter less than the free path carrier's scattering free path of free carriers for the scattering of optical phonons, the free carriers remain hot (energy is conserved) for a relatively long period of time, where this "hot duration" is at least as long as a period of time necessary for the absorption of infrared photons.

A few additional comments are warranted here regarding the term $\lambda_{fc}$, which is the De Broglie wavelength of the free carriers. This wavelength is a quantum parameter. According to the conventionally understood particle-wave duality principle or De Broglie's principle, free carriers can behave not only as particles, but also as waves characterized by a definite wavelength (or frequency). If the condition $\lambda_{fc} < d$ is satisfied, the wave-like properties of the free carriers may be ignored and the free carriers may be described as classical particles. Thus, the velocity of such particles and their interaction with atoms forming the constituent components of the composite structure (as well as boundaries between these materials) may be appropriately considered within the design of a competent composite structure.

Further the classical nature of the mesoscopic sized regions ensures that there is not quantization of the free carriers' energy states. In other words, the energetic gaps between various energy states are significantly less than the thermal energy "kT" associated with this relationship. Thus, a quasi-continuous spectrum of free carrier energy states exists, rather than just a few discrete energy states. Thus, the number of energy states within a mesoscopic sized region is very large and the region acts as a multi-carrier region.

By way of comparison, a conventional quantum dot has a size in the same order as the free carrier (particle) wavelength, and a discrete energy spectrum having but a few energy states. (The actual number of energy states depends, however, on the height of the energetic barrier and the depth of the quantum well). Thus, according to Pauli's Principle, the number of free carriers in quantum dots is limited and for most practical cases includes only a few free carriers per dot.

In some additional detail, the energetic barrier height, $\Delta E$, may be expressed as $\Delta E = 102_{surround} - \chi_{mesoscopic} \pm \delta E_{int\,erfacestates}$, where $\chi_{surround}$ is the electron affinity of of the surrounding wide-bandgap material, $\lambda_{mesoscopic}$ is the electron affinity of the material forming the mesoscopic sized regions, and $\delta E_{int\,erfacestates}$ is the change of the barrier height due to various interface states at the boundary between these two materials. From this relationship, the importance of the interface between the two constituent materials is apparent. Qualitatively, $\delta E_{int\,erfacestates} = e \cdot \Delta \phi_s$, where e is the electron charge and $\Delta \phi_s$ is a complicated function depending on the number (or density) of the interface states and expressing a difference between the electrical potential on the surface and that of an associated bulk material. (At present, no acceptable theory exists to accurately calculate the influence of the boundary interface states. As a consequence, the barrier height must be measured experimentally rather than calculated). However, as is conventionally understood from the bandgap engineering of QWIPs and QDIPs, the relative electron affinities for the materials forming the composite structure may be determined by careful selection of the materials.

A few additional comments are also warranted at this point regarding the nature of "free carriers" and their interaction with the atoms of a mesoscopic sized region. Classical free carriers are contemplated within the context of the present invention. In the exemplary context of an optically pumped composite structure, free carriers are heated (i.e., become hot) under the influence of pumping source generated photons having energy, $E_{Ph}^P$. (A "hot" free carrier is one having an energy much greater than the thermal energy value kT). Hot free carriers have high kinetic energy defined by $E_{ph}^P - E_g^{Si} \gg kT$. Under the influence of this added energy, hot free carriers begin to move and collide with (i.e., become scattered by) the atomic lattice of the material forming the mesoscopic sized regions. Intervals between collisions (i.e., scattering acts) are characterized by a momentum relaxation time, $\tau_{fc}^P$. During each act of collision, free carriers lose energy and are cooled. The portion of the energy transferred from a free carrier to a lattice atom during a single collision, $\Delta \epsilon$, (termed in language of quantum mechanics "a phonon emission") is very small because the free carrier's mass, $m_{fc}$, is significantly less than the mass of the lattice atom, $M_A$. This event may thus be expressed as $\Delta \epsilon = \epsilon_o \sqrt{m_{fc}/M_A}$, where $\epsilon_o$ is the energy of free carrier before collision (before first collision $\epsilon_o = E_{Ph}^P - E_g^{Si}$).

Such collisions are quasi-elastic, i.e. the free carrier's velocity vector is changed but without material significant change to its absolute value. Therefore, complete cooling of a hot free carrier to the lattice temperature, in order to obtain thermal equilibrium between the free carriers and the lattice, requires a considerable number of collisions over a time-energy relaxation period, $\tau_{fc}^\epsilon$. Thus, the energy relaxation mean free path $l_{fc}^\epsilon = \overline{V_{fc}} \cdot \tau_{fc}^\epsilon$ is much longer than the momentum relaxation free path $l_{fc}^P = \overline{V_{fc}} \cdot \tau_{fc}^P$, where $\overline{V_{fc}}$ is the mean velocity of a free carrier having kinetic energy $\epsilon$.

Therefore, the condition $d < l_{fc}^P$ necessarily requires the condition $d < l_{fc}^\epsilon$. These relationship expressions are accurate where the number of free carriers is not very large. For example, in metals or degenerated semiconductors the main energy relaxation mechanism is collisions between hot and cold carriers. In this case, the energy transfer is very effective because of the relative equality in masses, and $l_{fc}^\epsilon$ and $l_{fc}^P$ are of the same order. So the condition $d < l_{fc}^P$ expresses the fact that a free carrier can not dissipate its energy before collisions with the surface atoms. But near the surface a free carrier's wave function is small because of the existence of the energetic barrier. At the same time, the number of surface atoms $N_s$ is less than the number of atoms in the bulk $N_h$: $N_s/N_h = 1/d$, therefore efficiency of energy losses and the resulting emission of surface phonons is small. Thus, satisfaction of the condition $d < l_{fc}^P$ leads to a significant reduction in the free carrier-to-lattice atom interactions in a composite structure comprising, for example, mesoscopic sized semiconductor or metal regions surrounded by a wide bandgap matrix material.

As noted above, under the specified conditions, the atomic structure forming the mesoscopic sized regions and the free carriers within the mesoscopic sized regions remain thermodynamically uncoupled. That is, atoms forming the mesoscopic sized regions remain thermally isolated from the free carriers, whether the free carriers are existing or induced within the mesoscopic sized regions. Accordingly, the free carriers may exist at a very different thermal energy state, as compared with the thermal energy state of the atoms forming the mesoscopic sized regions.

The resulting thermal isolation of free carriers from the atomic structure forming the mesoscopic sized regions allows the development of a steady state, non-equilibrium distribution of hot free carriers within the mesoscopic sized regions embedded within the surrounding material.

Once developed this steady-state, non-equilibrium, free carrier distribution can be applied to a number of technical problems involving the detection and/or processing of one or more optical signals. The term "optical" as used herein means radiated, reflected, emitted, or refracted energy occurring anywhere within the electromagnetic spectrum, and specifically includes energy having one or more wavelengths ranging from ultraviolet (10-8 cm) to radar (1 cm).

The up-conversion of IR radiation is one specific example of the present invention's broad application. An IR related example will be used throughout this disclosure to more particularly illustrate the making and use of the present invention. It is, however, only one exemplary application. Before describing this exemplary application in greater detail, some contextual discussion would be beneficial.

Silicon ("Si") has proven itself as the material of choice for visible spectral range image sensors. Conventional CCD and CMOS imagers are widely used in video and digital cameras and their enabling manufacturing/processing technologies are very mature and cost-effective. However, the natural band-gap of bulk Si (approximately 1.1 eV) manifests its transparency for IR radiation at wavelengths longer than 1.1 microns. Accordingly, Si is not sensitive to radiation in the MWIR and LWIR spectral ranges.

In view of the basic limitation, some specialized media is required. Ideally, the specialized media would be compatible with conventional, silicon-based integrated circuit fabrication technologies. It would capable of effectively converting an IR photon flux into a visible photon flux at room temperature. It would also allow optical coupling with conventional CCD or CMOS imagers. With these attributes, the specialized media would allow construction of an all-silicon, IR imager that would quickly become the IR image sensor or system of choice for a vast number of commercial and military applications.

First attempts to create IR image sensors by converting incident IR radiation into visible light for subsequent processing by conventional, Si-based, quantum imaging circuits began nearly 30 years ago. As noted in a 1976 US government study: "[a]side from a basic interest in the phenomenology, parametric up-conversion has several possible applications. The shift of IR wavelengths to the visible range allows the use of convenient detectors, which do not require cooling, or shielding and which have low-noise, amplification capabilities". (See, Krishnan, et al., Evaluation of Technologies for Infrared Imaging, Air Force Avionics Laboratory Technical Report AFAL-TR-76-82, Stanford Research Institute, Menlo Park Calif., May 1976; as excerpted in Infrared Imaging Using Nonlinear Optical Upconversion, SPIE Vol. 122, Advances in Laser Engineering, 1977).

Since this time, multiple technology veins have been well-mined in largely unsuccessful attempts to identify a practical up-conversion medium. The prior art can be arbitrarily divided into two categories: non-semiconductor and semiconductor technologies. These technologies are summarized briefly below:

Nonlinear Crystals

Infrared up-conversion in nonlinear crystals is a coherent phenomenon that relies on the interaction of different electrical fields as manipulated by the refractive index of certain crystals, such as LiNbO3. In essence, pump light having a particular frequency is selected to mix with infrared light to create a sum of frequencies and produce a desired output signal. Up-conversion in nonlinear crystals has been known and studied since the 1960's, but remains an area of continuing interest. Compare, for example, Kleinman et al., Infrared Detection by Optical Mixing, Journal of Applied Physics, 40, p. 546-59 (1969) with U.S. Pat. No. 5,195,104 issued Mar. 16, 1993 to Lasen, Inc. of Las Crues, N. Mex.

Continuing research into the implementation of nonlinear crystal based IR detectors puts forward new conceptual and systematic solutions of the desired up-converter. For example, one solution presented by contemporary crystal-based systems provides a nonlinear crystal capable of sum-frequency generation (SFG) at room temperature. (See, Brewer, C. D. et al. Space-bandwidth Product Enhancement of a Monostatic, Multiaperature Infrared Image Upconversion Ladar Receiver Incorporating Periodically Poled LiNbO3, Applied Optics, Vol. 41, No. 12, pp. 2251-62, 20 Apr. 2002). Through SFG, a pump field is coupled into the nonlinear crystal along with the received (IR) signal field. The resulting frequency summing produces a frequency shifted output signal in the visible spectrum corresponding to the received IR signal. The visible output signal may be subsequently captured by a "silicon CCD array." (See, Id. at 2252.)

Two Photon Frequency Up-Conversion Devices

Compared to other coherent frequency up-conversion techniques, such as optical harmonic generation or sum frequency mixing based on nonlinear optical effects, up-conversion lasing solutions do not require the use of phase-matching techniques, allow for the use of semiconductor lasers as pump sources and are capable of adopting waveguide configurations. Early two photon pumped (TPP) lasing devices combine a pump source with a number of different nonlinear crystals. However, the low operating temperatures (between 10 and 260° K.) requirements for these systems further distinguish them from the Design. (See, for example, Goa et al., Proc. SPIE-Int. Soc. Optical Engineering, Vol. 322, pp. 37-43, 1983, and Yang et al., Applied Physics Letters, Vol. 62, pp. 1071-73, 1993).

Room temperature TPP lasing has been achieved with the use of metal vapor or other gas-based up-conversion media. (See, Willenberg et al., Applied Physics Letters, Vol. 24, pp. 427-28, 1980, and Goldston et al., Laser Focus World, Vol. 27, 27-29, 1991). Similarly, room temperature up-conversion lasing has been successfully achieved in media doped with rare-earth ions. (See, MacFarlane, Applied Physics Letters, Vol. 54, pp. 2301-02, 1989 and Hanna et al., Optical Communications, Vol. 78, pp. 187-94, 1990).

Two photon pumped lasing, and more recently three photon excitation, have also been accomplished in media (e.g., porous glass) doped with organic dye solutions. Such work dates back to the 1970's, but remains an area of significant research investment. (See, for example, U.S. Pat. No. 6,402,037 issued Jun. 11, 2002 to the Research Foundation of State University of New York, and He et al., Observation of Stimulated Emission by Direct Three Photon Excitation, Nature, Vol. 415, pp. 767-70, 14 Feb. 2002).

The quantity of published research and apparent intellectual property investment directed to these disparate modes of accomplishing IR up-conversion is quite remarkable. The general lack of commercial success associated with these technologies is also remarkable, moreover non-linear crystals, metal vapor, rare-earth doped media, and organic dye based solutions to the IR up-conversion are very different from the desired silicon-based technology.

Two very fundamental problems related to silicon photonics must be solved in order to obtain a highly efficient, IR-to-visible light up-conversion layer. First, the question of how to get silicon to effectively absorb IR radiation must be addressed. Thereafter, the question of how to achieve efficient visible luminescence in silicon based structures must be addressed.

Regarding the first question of IR absorption, it has already been noted that bulk silicon, alone, is conventionally considered an inappropriate material for IR detection. The fundamental absorption of IR photons having energies less than the Si band-gap energy is negligibly weak. In so-called "extrinsic Si" photo-resistors, Si is doped with a particular impurity (e.g. Ga, As, In, Sb etc.), which creates electron states in the band-gap. These photodetectors use electron transitions between the impurity-derived levels and conductive or valence bands, and may be used to sense photons with the energies much smaller than the bandgap. Extrinsic Si photo-detectors are used in a wide range of IR spectrum extending from a few μm to ≈300 for μm. They are the principle detectors operating in the range $\lambda \gtrsim 20$ μm. The availability of highly developed silicon MOS technology facilities, the integration of large detector arrays with charge transfer devices for readout and signal processing, the well established technology also helps in the manufacturing of uniform detector arrays and formation of low noise contacts. Although the potential of large extrinsic silicon FPAs for terrestrial applications has being examined, interest has declined in favour of intrinsic—band-to-band detectors (HgCdTe an InSb) with their more convenient operating temperatures. Si extrinsic photoconductors are characterized by low quantum efficiency and detectivity. To maximize these parameters the doping level should be as high as possible. Increasing of doping concentration leads to increasing of dark current and noise, slow reaction time, and a requirement for extremely low operating temperatures (e.g., approximating that of liquid Helium or about 4° K.). Such low operating temperatures are required to prevent thermal excitation of carriers from the impurity levels and therefore the thermal noise. Accordingly, the use of such detectors is mostly limited to stationary systems for space- and ground-astronomy applications, particularly in low-background flux and for wavelengths from 13 to 20 μm, where compositional control is difficult for HgCdTe.

Another solution to the problem of IR absorption uses band-gap engineering concepts and related quantum size effects to create IR sensitive, intersubband, Si-based QWIPs or QDIPs. Unfortunately, since the electron effective mass in Si is large, being just a little smaller than that of free electron mass, only very small, nanometer-sized quantum wells or dots are useful for IR photon intersubband absorption. The fabrication of wells and/or dots having such dimensions involves great technical challenges. Moreover, known matrix materials that provide high quality interface with Si, such as $SiO_2$, are characterized by very large conductive band offset (~3.7 eV conductive band offset between Si and $SiO_2$) that considerably reduces the detectivity and requires application of very high bias voltages. In yet another alternative approach to the formation of Si-based intersubband QDIPs, germanium dots are formed in a silicon matrix. However, this approach involves epitaxial growth techniques that are problematic and not compatible with conventional, SI-based IC fabrication techniques.

Regarding the second question of visible luminescence in Si-based structures, the luminescence efficiency of silicon is miserable, being something in the order of 10-4 quantum efficiency at 300° K. This low efficiency is explained by the indirect nature of Si band-gap. The electron-hole radiative recombination process can only occur if momentum is conserved. In indirect materials, conservation of momentum occurs via the transfer of momentum to a phonon. Such a three-body process is quite inefficient compared with direct gap recombination. This is the main reason why silicon is such a poor light emitter.

Many quite different approaches to alleviating the miserable light emission in silicon, have been proposed and are actively being explored. The present invention is best understood against a backdrop of these mostly failed attempts. Some, such as $Si_{1-x}Ge_x$ quantum well or Si/Ge superlattice structures rely on band structure engineering. Others, such as quantum dots or porous silicon (π-Si), rely on quantum confinement effects in low dimensional structures. Still others rely on impurity-mediated luminescence from isoelectronic substitution or the addition of rare earth ions. In order to understand these background approaches and to readily distinguish the benefits of the present invention, it is appropriate to review the optical emission problem associated with crystalline silicon.

Some attempts have tried to (1) increase the efficiency of luminescence by increasing the overlap of the electron and hole wave-functions via, for example, confinement and/or band structure engineering; (2) tune the wavelength of the emission by forming particular alloys and molecules; and/or (3) induce recombination at impurity centers. In this context, it should be noted, that introduction of impurities leads to a corresponding increase in the wavelength of the photoluminescence. Impurities create electron states within the Si bandgap. The electron transitions related to impurities are characterized by energies lower than that of the bandgap. Therefore, the corresponding wavelength of the emitted light is longer than the long cut-off wavelength of the Si absorption spectrum (~1.1 micron), and consequently cannot be detected by Si detectors.

Thus, the direct use of different kinds of impurities is not an appropriate approach to the problem of forming an up-conversion layer optically coupled to CMOS imager. In order to enhance coupling efficiency, it is desirable to shift the photoluminescence peak to a shorter wavelength. In this way, overlap between Si absorption and photoluminescence spectrums is increased and, therefore, the efficiency of coupling is also increased.

Preferably, the emitted (photoluminescence) light wavelength will be longer than that of the pumping optical energy. Also, the CMOS imager will be shielded from the optical pumping energy by means of an optical filter, for example. These preferences strongly suggest that the respective wavelengths between the optical pumping energy and photoluminescence light will be sufficiently separated.

The emission of photons with energies significantly larger than the band-gap energy is impossible. Even in the case of photo-excitation by high-energy photons, non-equilibrium electrons waste their energy by scattering it on optical phonons within a very short time period, typically less than 10-12 second. Thus, the main radiative recombination remains between states defined by the bottom of conduction and the top of the valence bands. The resulting emission is characterized by photon energy at the band-gap energy.

Applying quantum confinement methods to the Si would enhance optical efficiency and increase the optical gap from the bulk value of 1.1 eV. In this case, interband radiative recombination would occur between the discrete energy levels induced by the quantum confinement within the Si confined structure. Various quantum confinement techniques have been investigated as possible approaches to overcoming the indirect band-gap limitation associate with silicon. Related light emission studies have considered the effect of Si-based nanostructures, including π-Si, nanoclusters, and quantum devices (wires and dots). Interest in silicon nanostructures stems from recognition of the emission effects of confinement on carrier wavefunctions when the crystalline diameter of a material is less than the size of the free exciton Bohr radius of 4.3 nm in bulk crystalline silicon. (As will be seen hereafter, this "recognition" which has become more of a working premise has completely skewed the focus of research into nanostructures). As presently understood, quantum confinement increases the electron/hole wave function overlap, resulting in increased light emission efficiency, and shifts the emission peak to higher energy states.

Porous silicon (π-Si) has been widely investigated for its potential is as a light-emitting, silicon material. It is created by electrochemical dissolution of silicon in hydrofluoric acid based electrolytes. Hydrofluoric acid only very slowly etches single crystal Si. However, passing an electric current between the acid electrolyte and Si speeds up the process considerably, leaving an array of deep, narrow pores running generally perpendicular to the Si surface. These pores measure only nanometers across, but micrometers deep.

Si quantum wires are formed in π-Si by joining up the pores, thereby leaving behind an irregular array of undulating, free-standing pillars of crystalline silicon only nanometers wide. Where appropriately etched under sharply controlled conditions, such π-Si structures can emit visible photoluminescence at room temperature. Indeed, π-Si structures have been formed that emit light across a range extending form near infrared, through red-yellow and into blue.

Numerous studies make it clear that photoluminescence in π-Si is very sensitive to the chemistry of π-Si production and related treatment(s). Crystalline Si wires, spherites, and amorphous silicon (a-Si) material, in any combination may be formed in a given π-Si sample. Porous Si layers thus formed are far from uniform. Further, improvements in quantum efficiency and power dissipation are required for practical applications of this technology to arise.

Ultimately, contemporary π-Si research has concluded that a strong correlation exists between the optical absorption energy gap (and corresponding photoluminescence peak energy) and the pore diameters in the π-Si material. See, Lockwood et al., Photoluminescence in π-Si due to quantum confinement, Advanced Luminescent Materials, Electrochemical Society (1996), Pennington, pp. 166-172. According to this research, nanoparticle size should be limited to less than 5.5 nm in order to obtain "sufficient" quantum efficiency (or optical gain).

In a related approach, nanometer sized silicon crystallites are grown directly from a gas phase or indirectly by re-crystallization within a matrix, instead of being formed by etching. In fact, a suggestion that a nanoparticle size dependence of the photoluminescence energy in very small Si crystallites pre-dates the similar finding in π-Si. One exemplary bit of research found that the photoluminescence peak energy varied with the diameter of Si nanoparticles and concluded that the quantum confinement effects are maximized for nanoparticle diameters between 3 and 5 nm. See, Takagi et al., Quantum size effects on photoluminescence in ultra-fine Si particles, Applied Physics Letters, Vol. 56, pp. 2379-80 (1990). However, like a-Si, the emitted light energy falls well below that expected from theoretical calculations of the energy gap. Also similar to n-Si, the formation of Si nano-clusters varies and suffers accordingly from variations particle size, particle density and distribution, as well as surface chemistry effects.

Indeed, the vagaries and complexities of the nanocrystal interfaces and its effect on photoluminescence have proved so daunting that researchers can not agree upon the actual mechanism accounting for light emissions in such structures. Compare, Tong et al., Visible electroluminescence from nanocrystallites of Si film prepared by plasma enhanced chemical vapor deposition, Applied Physics Letters, vol. 69, pp. 596-98, ascribing the effects to near surface states, and Toyama et al., Visible photo and electroluminescence from electrochemically formed nanocrystalline Si thin film, Applied Physics Letters, vol. 69, pp. 1261-63, ascribing the effects to quantum size effects.

Regardless of the photoluminescent mechanism ascribed, the conventional wisdom holds that only nano-sized Si particles are worthy of investigation, and/or deemed likely to result in successful light emissions. The term "nano-sized" connotes particle having a diameter ranging from 1 nm up to less than 100 nm. See, for example, Charvet et al., Ellipometric Spectroscopy Study of Photoluminescent Si/SiO2 Systems Obtained by Magnetron Co-Sputtering, Journal of Luminescence, Vol. 80, pp. 257-61 (1999) finding a highest energy peak for nanoparticles having diameters in the 2.0 to 2.5 nm range; Pavesi et al., Optical Gain in Silicon Nanocrystals, Nature, Vol. 408, pp. 440-44, (23 Nov. 2000), identifying only nanoparticles≈3 nm; Zhu et al., Growth of High Density Si Nanoparticles on Si3N4 and SiO2 Thin Films by Hot-Wire Chemical Vapor Deposition, Journal of Applied Physics, Vol. 92, No. 8, pp. 4695-98 (2002), describing silicon nanoparticles ranging in sizes ranging from 2 to 9 nm; Chen et al., On the Photoluminescence of Si Nanoparticles, Material Physics Mech., Vol. 4, pp. 62-66 (2001), describing silicon nanoparticles ranging in size from 3 to 80 nm formed by a thermal evaporation process; and, Zhang et al., Blue photoluminescence and local structure of Si nanostructures embedded in SiO2 matrices, Applied Physics Letters, vol. 66, pp. 1977-79 (1995), describing two material samples of Si clusters having no clusters with a diameter greater than 5 nm.

Another approach to light emission with photon energies larger than the band-gap assumes the creation of Si/wide band-gap material hetero-interface, e.g., Si dots embedded into wide bandgap material, superlattices, quantum wells or quantum wires), with the appropriate interface radiative states. It is well documented that, Si/SiO2 hetero-interface, for example, involves such states. In this situation radiative recombination occurs at the materials interface. Historically, control of the interface states is very challenging. Both density and energy are so extremely sensitive to vagaries in the fabrication processes as to be practically uncontrollable. Moreover, the large number of non-radiative states that always exist on the interface significantly decreases the probability of radiative recombination.

Alternatively, hybrid materials have been explored where, for example, direct gap GaAs is joined with Si. In one approach, alloying germanium (Ge) with Si allows engineering of the electronic band structure, where the energy gap may be varied in relation to alloy composition. Unfortunately, such alloys suffer from hetrostructure stability limitations, such that deposition layers formed from these compounds must be kept thinned than some critical value. As a result, the absorption region of photodetectors formed from such alloys is necessarily small. Also, the band-gap for these compounds remains essentially indirect.

The two fundamental problems associated with silicon-based photonics, namely insensitivity to IR radiation and the weak luminescence, are solved by the present invention. In one aspect of the present invention, a novel physical phenomenon, namely Steady-State Non-Equilibrium Distribution ("SNED") of free carriers is realized using Mesoscopic Classical Confinement ("MCC"). Such a distribution, and the resulting benefits explained hereafter, can be implemented using a specialized active media.

Photo-induced SNED engineering foresees the creation of steady-state, non-equilibrium, distribution of photo-induced free carriers in a quasi-continuous spectrum in a conductive or valence band of mesoscopic sized semiconductor or metal regions (or alternatively "particles") embedded in wide band-gap semiconductor or dielectric material. A particular distribution of photo-electrons can be induced by a pumping light source only when MCC is taking place (i.e. when the cooling time of the non-equilibrium electrons is longer than the time needed for the electrons to reach the interface between the mesoscopic particles and the matrix material, hereafter defined as "MCC transition time").

MCC transition time is determined solely by: (1) the hot electrons' velocity (or kinetic energy); (2) the size of mesoscopic particles; and, (3) the type of hot electron motion, as between diffusion or ballistic motion. The cooling time is defined as the time required by the hot electrons to dissipate their energy through a free carrier-to-phonon or free carrier-to-free carrier interaction.

In a specialized media or composite structure, which consists of mesoscopic sized particles surrounded by wide band-gap matrix material, the cooling time is significantly longer than that of the bulk material. Such a long cooling time is the consequence of a "phonon bottleneck" and of the difference between the respective acoustic impedances of the particles and the matrix material. The sufficiently large ratio between the cooling time and the MCC transition time makes it possible to maintain a specific steady state distribution of hot electrons. The energy of the distribution's maximum is engineered by changing the pumping light photon energy, whereas the form of the distribution is engineered by the size of the mesoscopic particles and the quality of the interface between materials forming the composite structure.

In an ideal situation, a very narrow distribution of free carriers is achieved. In principle, this approach, together with the nature of the energetic barrier defined within the active media, opens new opportunities for creating an artificial media with highly desirable, dynamically tunable optical properties. For example, an artificial media that contains a confined high-density plasma of steady state, non-equilibrium free carriers, created by pumping light (first photon absorption) with predefined energy can be made to absorb photons, emitting by an external target (second photon absorption). Introduction of a causal potential barrier into the system, through the appropriate choice of mesoscopic particles and surrounding matrix material leads to a novel type of photodetection characterized by a tunable cut-off wavelength.

Arriving from a target, IR photons with energies equal to or higher than that of the energetic barrier height, as defined by the energy of the pumping light, may be detected electrically by applying transverse bias voltage across the composite structure, as with QWIP structures. Such IR photons may alternately be detected optically by enforcing the free carriers' radiative recombination on the interface between materials forming the composite material or within the bulk of the matrix material surrounding the mesoscopic sized regions. Either step of electrical or optical detection is typically followed by a step of detecting the resulting luminescence using conventional means.

Within one embodiment of the present invention, a completely new silicon-based, (and, hence, compatible with conventional integrated circuit fabrication technologies), active media, consisting of silicon mesoscopic size particles surrounded by wide band-gap semiconductor or dielectric material, such as SiO2, Si3N4, Al2O3, or amorphous Si. This active media (a specific composite structure) is characterized by highly efficient double-photon induced photo/electro luminescence, which can be used as an efficient up-conversion layer from IR-to-visible light, or IR-to-Near IR (NIR) light.

An additional unique feature of the contemplated composite structure is the high yield of IR-to-visible (or NIR) light conversion at room temperature. Due to the ineffective interchange of the energy between electrons and mesoscopic region lattice atoms, the electronic and atomic systems are thermodynamically independent and the temperature of the hot free carriers may be significantly higher than that of the lattice. The effect of relatively small lattice thermal energy fluctuations on the energy of overheated, non-equilibrium free carriers is negligible, thus allowing highly efficient room temperature operation. Of addition note, and in great contrast to conventional technologies, the optical up-conversion process provided by the present invention is thermally noiseless.

Optical coupling of an up-conversion composite structure formed according to the present invention with a conventional CMOS imager yields a quantum, uncooled, high performance, whole-optical, wavelength dynamically tunable, IR image sensor. The introduction of radiative recombination centers into the matrix material surrounding the mesoscopic sized regions enables effective luminescence despite the well-documented problems of pure light emission from silicon. As one exemplary application of this new approach, a silicon-based, quantum, uncooled, wavelength tunable IR image sensor is presented in some additional detail below.

The present invention fundamentally departs from the conventional presupposition that matrixes formed with only embedded nano-sized particles are a potential solution to the problem of poor photoluminescence from silicon-based materials. Quite to the contrary, the present invention concludes that the quantum confinement effects, occurring in nano-sized particles, only involve a few photo electrons per particle. Thus, sufficient photon absorption or photo-excitation and its subsequent photoluminescence efficiency can only be achieved by means of a very large number of nano-sized particles. Stated in other terms, the density (number per unit area) of the nano-sized particles must be very high.

As has been noted above, the conventional formation of nano-sized particles layers is fraught with issues of uniformity. More importantly, the required high density for nano-sized particles results in shorter mean separation distances between neighboring particles. Such short separation distances allow complex quantum interactions between the neighboring particles, and results in changes to the energy states and distribution of electrons associated with the nano-sized particles.

In contrast, one presently preferred embodiment of the invention comprises mesoscopic-sized silicon, or other narrow band-gap semiconductor material such as InAs, HgTe, Ge etc., or metals particles, such as Al, Cu, etc., embedded within a matrix of wide band-gap semiconductor or dielectric materials, such as SiO2, Si3N4, AlAs, GaSb, CdTe, ZnS, etc.

The term "mesoscopic" refers to particles (or regions) with a mean diameter size greater than 10 nm (10-6 cm), but less than 1 micron (10-4 cm), and more specifically includes the range from about 50 nm through about 500 nm.

Mesoscopic particles comprise a great number of atoms, ranging for example from 106 to 109 atoms per particle, and, therefore, comprise a great number of valence electrons. The electron/hole energy spectrums for the mesoscopic particles are similar to those of the bulk material. This means that instead of the discrete energy levels, i.e., discrete density of energy states, inherent in nano-particles as defined by the quantum size effect, mesoscopic particles are characterized by well-defined conductivity and valence bands, with a large quasi-continuous, (that is the distance between energetic states is less than thermal energy—kT), density of energetic states. Embedding such particles within a wide bandgap semiconductor material leads to the creation of wide (i.e., the quantum size effect is not relevant) potential wells having depths defined by the natural conductive $\Delta E^C$ or valence $\Delta E^V$ bands.

Under the influence of a photon flux incident from an external pumping source with the energies, $E_{PH}^P$, larger than the silicon bandgap energy, $E_g^{Si}$ but smaller than max($E_g^{Si}$+$\Delta E^C$, $E_g^{Si}$+$\Delta E^V$), the mesoscopic sized potential wells induce the mesoscopic classical spatial confinement of a large number of photo-excited free carriers. The number of such steady state, non-equilibrium free carriers, $\Delta n_{ph}^{mes}$, may be very large due to variation of the pumping light intensity.

From this point of view, the mesoscopic size particles are multi-carrier particles, whereas the nano particles may have only a few photo-excited carriers on several discrete levels.

Thus, the absorption coefficient for mesoscopic size particles is several orders of magnitude greater than those associated with nano-sized particles. Given this greatly expanded influence on the development of free carriers, the density of the embedded mesoscopic particles may be reduced to a point where undesirable interactions between neighboring particles are eliminated. Consequently, unlike materials having embedded nano-sized particles, fluctuations in the density, distribution, and size of mesoscopic particles have only a weak influence on the electrical and optical properties of the resulting composite structure. Thus, the multitude of fabrication problems associated with the precision control over the size, density and geometrical form of nano-sized particles is obviated by the present invention.

As noted above, the quantum confinement effects associated with nano-sized particles exhibit a distribution of non-equilibrium electrons having a very finite set of energy states. That is, the corresponding energetic spectrum of electrons is highly discrete in nature. Electrons populating this discrete set of energy states are separated within their respective states by intervening "dead-zones" in the energy spectrum. This fixed, finite, and dead-zone separated sequence of energy states allows only a limited number of possible state transitions for electrons within the discrete energetic spectrum. Therefore, in the case of IR detection, the nano particles may be used as QDIPs based on the photo-induced bound-to-bound or bound-to-continuum IR absorption. Such absorption is weak because only a few non-equilibrium electrons per particle are excited within the discrete energy levels and are accordingly available to participate in detection process.

In contrast, mesoscopic sized particles are associated with sufficiently large absorption coefficient(s) and a quasi-continuous density of energy states. MCC allows nearly continuous electron excitation by means of an external optical pumping source from the valance band up to and through multiple energy states in the conductive band. Created by the pumping light source, a steady state electron plasma consisting of $\Delta n_{ph}^{mes}$, photo-induced electrons with energies of about $E^{PhP}-E_g^{Si}$ may be used in the process of IR radiation detection for photon energies defined by the expression $h\nu_{IR} \geq E_g^{Si} + \Delta E^C - E_{Ph}^P$. Electrons that successively absorb two photons, $E^{PhP}$ and $h\nu_{IR}$ (where h is the Plank's constant and v is the frequency of IR light), are capable of overcoming the energetic barrier $E_g^{Si} + \Delta E^C - E_{Ph}^P$ and reaching the surrounding matrix material where they may be captured by radiative recombination centers. Such capturing is accompanied by the emission of light that can be detected by a conventional silicon photodetector.

This is the innovative type of IR detection proposed in one aspect by the present invention. The minimum energy of IR photons absorbed by non-equilibrium electron plasma, which is sufficient to raise an electron above the potential barrier, defines the long cut-off wavelength of such IR detector. This cut-off wavelength is tuned by the choice of pumping light wavelength.

As has been discussed above, the entire thrust of conventional materials engineering and silicon-based confinement-effects designs is the creation of a direct bandgap or direct bandgap-like material from a naturally occurring indirect band-gap material. Thus, the conventional art purposely alters the natural spectrum of electron states associated with the indirect band-gap material(s). By such alterations, the probability of electron/hole re-combinations within the conventional nano-sized particles is elevated.

However, within the context of the present invention, the photon irradiation resulting from electron/hole re-combinations within the silicon mesoscopic particles is undesirable, because such photon leakage actually decreases the number of excited (hot) electrons available for IR photon absorption. Thus, the present invention avoids altering the spectrum of energy states inside of silicon mesoscopic particles. The mesoscopic sized particle material thus retains its indirect bandgap nature and the overall probability of radiative electron/hole re-combination inside the particles remains small.

In the present invention, the problem of ineffective light emission from silicon is further addressed in a further related aspect by the introduction of radiative recombination centers into surrounding matrix material. The amorphous nature of the matrix material with its inherent direct bandgap properties allows insertion of a tremendous number of such centers and provides strong light emission. The beneficial effects of such impurity doping are well understood in, for example, the conventional formation of light emitting optical fibers doped by rare earth atoms, such as erbium.

The conventional silicon-confinement structures also lose hot electrons via a tunneling phenomenon. Non-equilibrium electrons may pass under a potential barrier between the embedded particles and the matrix material and recombine on interface states. To prevent this phenomenon, a sharp and clean interface is required, without the presence of intervening interface states. For example, where crystalline silicon (Si) mesoscopic particle are embedded in a SiO2 matrix material the Si/SiO2 interfaces must be very sharp and clean without intervening or transitional SiOX material between the interface edges. The same principle holds true for contaminates of any other kind. The undesired tunneling of hot electrons from the mesoscopic particles through the interface states are avoided in large part by a sharp, clean interface, without any unoccupied interface states.

Thus, some distinctions between silicon-confinement structures formed from conventional nano-sized particles and those formed by mesoscopic-sized particles include: particle size, the density of the particles within the matrix material, the sensitivity of the overall design to the distribution and density of the embedded particles, the number (or density) of electron/hole re-combinations occurring within the embedded particles, the nature of the interface between the embedded particles and the surrounding matrix material, and the large number of radiative recombination centers introduced into the matrix material in a controllable manner.

Figure 2A:
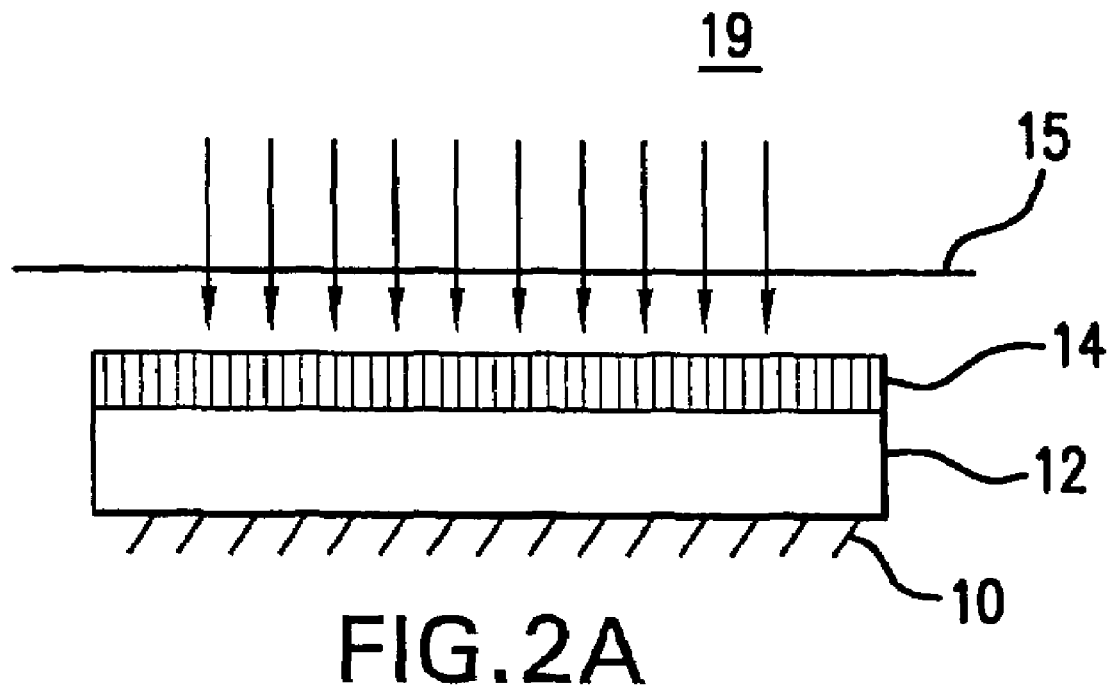
FIGS. 2A, 2B, 3 4A, 4B, and 4C illustrate exemplary methods whereby mesoscopic regions or particles are formed as part of the fabrication of a composite structure.

The formation of mesoscopic particles within a wide band-gap matrix material is illustrated in several exemplary embodiments shown in FIGS. 2A, 2B, 3, and 4A-4C. In FIG. 2A, a working substrate or insulator 10 receives one or more layers of matrix material 12 and thereafter one or more layers of particle material 14. Particle material 14 is preferably amorphous silicon (a-Si), but may be any other material suitable for the subsequent formation of mesoscopic particles. The matrix material is preferably SiO2, but may any similar oxide or nitride material.

Figure 2B:
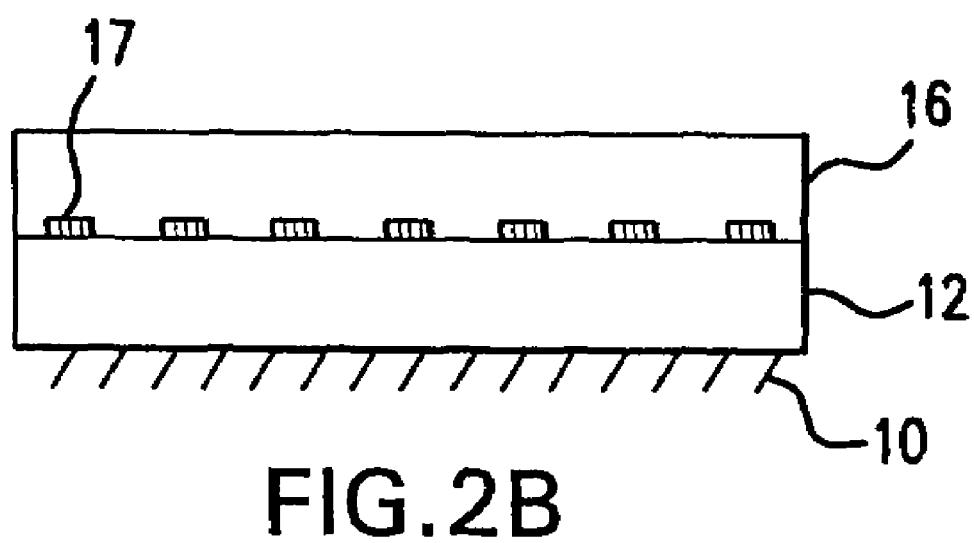

Using a conventionally produced photolithography mask 15, islands of particle material 14 are developed using any number of well-understood lithographic techniques 19. Following development and etching, the particle material islands 17 are created. Conventional wet and dry etch processes are suitable for use with the foregoing process. Thereafter, as shown in FIG. 2B, a second layer of matrix material 16 is deposited over the particles 17, thereby encapsulating (or embedding) the particles. Multiple iterations of this process may be performed to yield a stack of embedded particle layers. At the end, the whole sandwich is annealed, and in the case of a-Si, crystalline Si particles 17 are produced.

Alternatively, a particle material layer may be deposited between matrix material layers and rapidly annealed to crack and convert the particle material layer into crystalline particles of substantially mesoscopic size. The tolerance of the present invention for varying particle distributions and particle sizes makes this simple annealing method practicable. The annealing temperature, pressure, and environment (including annealing gas) are varied in relation to the exact thickness and composition of the particle and material layer(s).

Similarly, a layer of a-Si may be converted into an acceptable distribution of crystalline silicon particles by means of laser-induced re-crystallization. The size and density of the particles is a function of laser light wavelength and processing temperature, pressure, and environment.

Mesoscopic sized Si particles may be embedded within an SiO2 matrix using magnetron sputtering, plasma enhanced chemical vapor deposition, or an electron gun followed by an annealing step. Indeed, many conventional semiconductor processes, and in particular conventional lithography techniques, are better adapted to the formation of mesoscopic particle in the present invention than they are to the formation of nano-sized particles.

Figure 3:
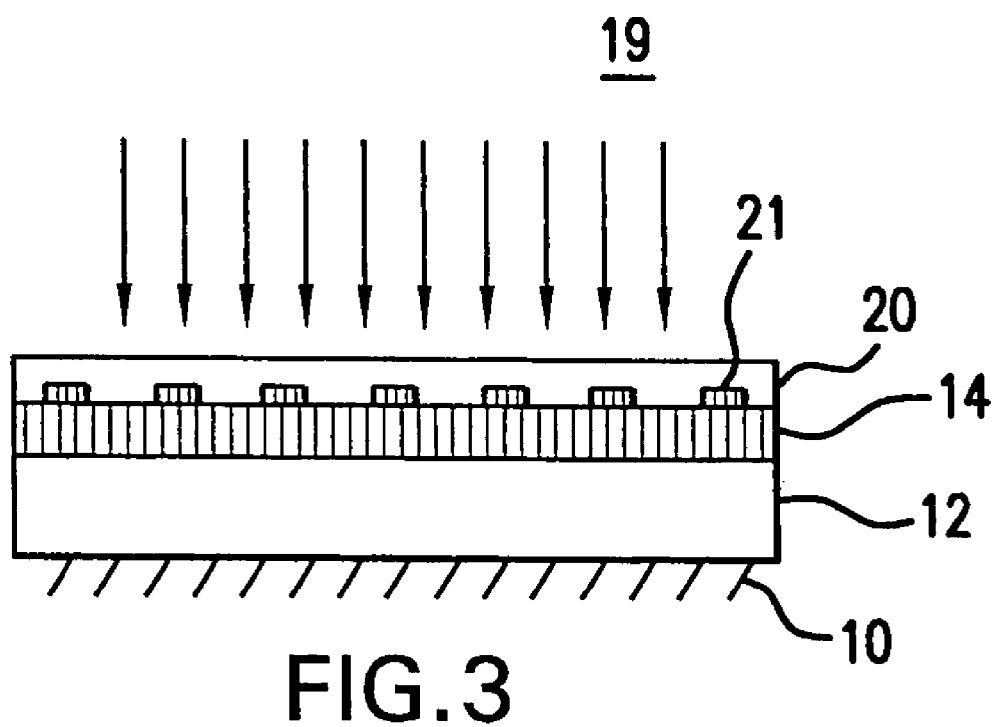

However, another exemplary method for the formation of mesoscopic particles within a matrix material is illustrated in FIG. 3. Here, a photoresist slurry is made using a conventional, liquid photoresist 20 and metal particles of appropriate size and shape 21. Aluminum or aluminum oxide may be used as the metal. Metal particles 21 are evenly distributed in the liquid photoresist 20, which is applied (spin coated and cured) over a material layer 14. Thereafter, material layer 14 may be developed and etched using conventional techniques.

Figure 4A:
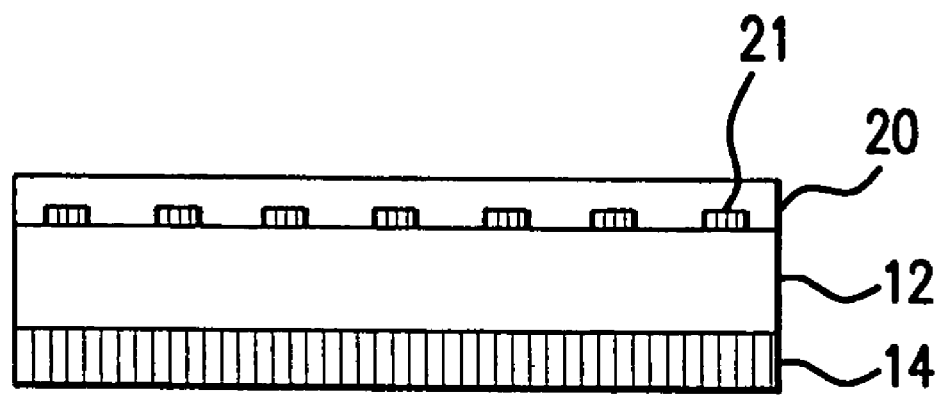
Figure 4B:
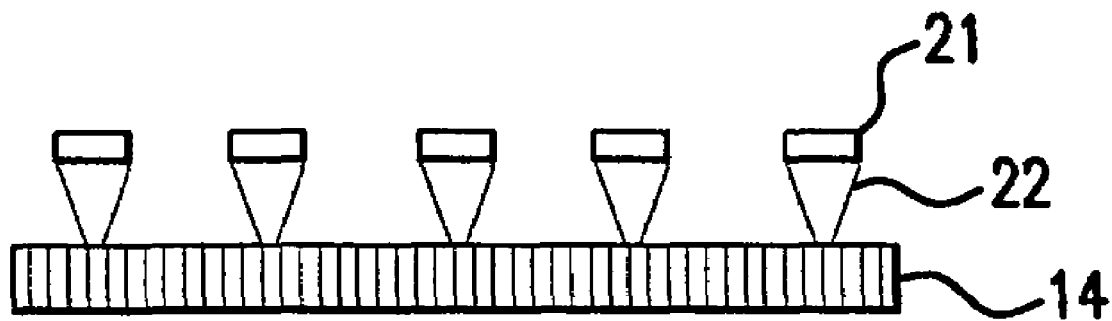
Figure 4C:
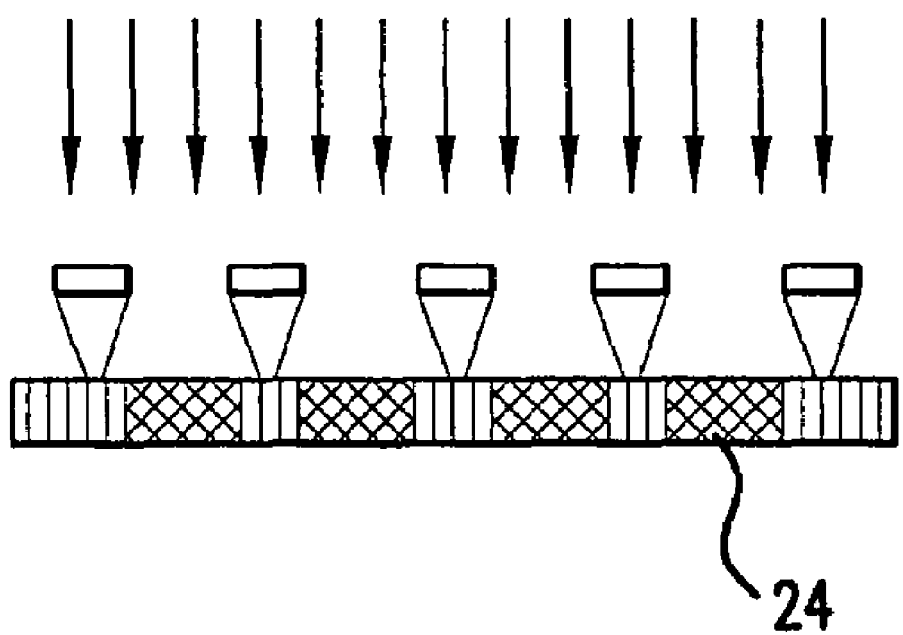

Alternatively, as shown in FIGS. 4A, 4B, and 4C, the metal impregnated photoresist slurry (20, 21) may be spin coated over a sacrificial SiO2 layer 12 covering an a-Si layer 14. Using a conventional etch process, the bulk of SiO2 layer 12 is removed, excepting certain islands 22 formed under metal particles 21. After formation of islands 22, selectively exposed portions of a-Si layer 14 are developed using conventional means. Mesoscopic sized particles 24 may thus be obtained once the residue of a-Si layer 14 is removed.

Figure 5A:
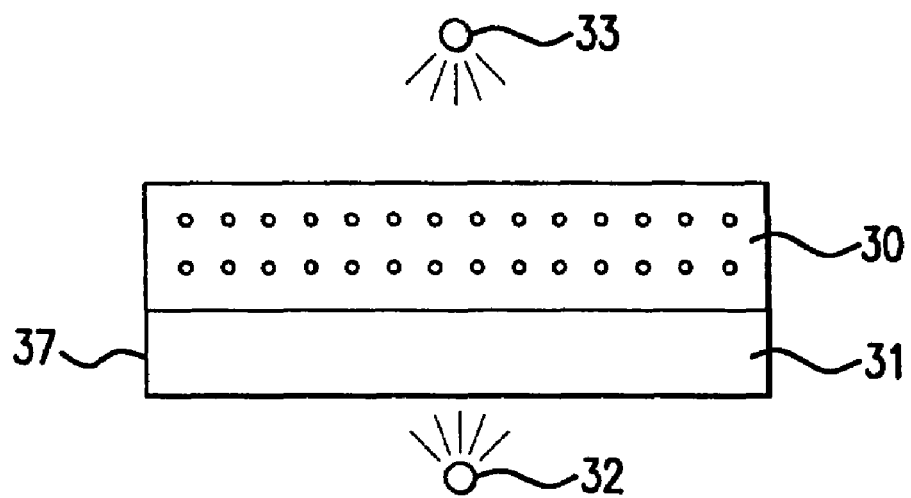
FIG. 5A illustrates an exemplary pumping source configuration in relation to a composite structure.

As in the Si-confinement structures relying on nano-sized particles, the wide band-gap material having embedded mesoscopic particles according to the present invention requires a pumping optical energy source to produce significant light emissions. As shown in FIG. 5A, a surface, optical pumping source 33 may directly apply optical energy to the surface of upconversion layer 30. Alternatively or in combination with surface pumping source 33, a substrate pumping source 32 may apply optical energy through a transparent support layer 37.

Figure 5B:
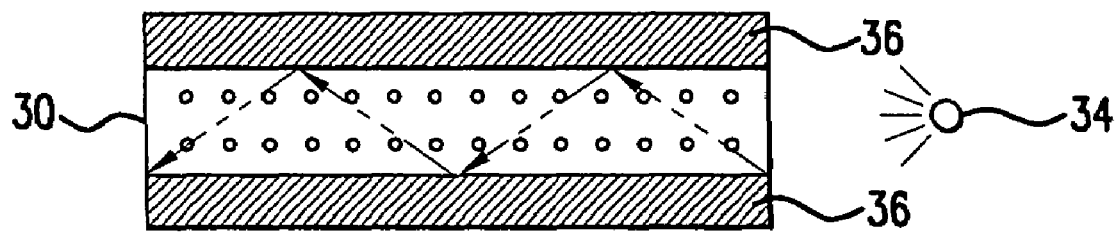
FIG. 5B illustrates an exemplary waveguide/pumping source configuration in relation to a composite structure.

In other applications, it is highly undesirable to have optical pump energy (at one or more discrete wavelengths) applied anywhere but to upconversion layer 30. Where such is the case, a waveguide structure (e.g., a Bragg reflector) may be used to communicate pump energy to upconversion layer 30 while optically isolating semiconductor layers above and/or below the upconversion layer. This approach is shown in FIG. 5B where optical pump energy is laterally introduced using a conventional coupler to the waveguide formed by layers 36 sandwiching upconversion layer 30. The selection of an appropriate waveguide materials, e.g., silicon nitride-silicon dioxide multilayer sandwich, is a function of wavelength separation requirements and the nature of the semiconductor layers adjacent to upconversion layer 30.

While an Si/SiO2 combination of materials has been, and will continue to be cited as a presently preferred embodiment, the present invention is not limited to this particular combination of materials.

Yet a Si/SiO2 combination is preferred for good reason. Namely, many valuable commercial applications readily lend themselves to the introduction of an improved optoelectronic device formed from a combination of these materials. Infrared imaging systems are an excellent example of such applications.

The present invention describes and introduces an apparatus and method for performing frequency-shifting, often referred to as up-conversion, of infrared radiation into the visible light range, such that subsequent imaging may be accomplished by means of a conventional visible light imaging circuit. Within this context, the wide band-gap material having embedded mesoscopic particles, according to the present invention, will be generically referred to as the "up-conversion" layer.

As noted above, many excellent visible light imaging circuits are economically implemented using conventional CMOS techniques. At present, such CMOS circuits are combined with high performance photodetectors only through relatively expensive and difficult hybrid technologies.

In contrast, an upconversion layer according to the present invention may be readily and economically integrated with conventional CMOS imaging circuits using a mature body of fabrication techniques developed in the integrated circuit industry. An example of such integration is shown in FIGS. 6A, 6B, and 6C.

Figure 6A:
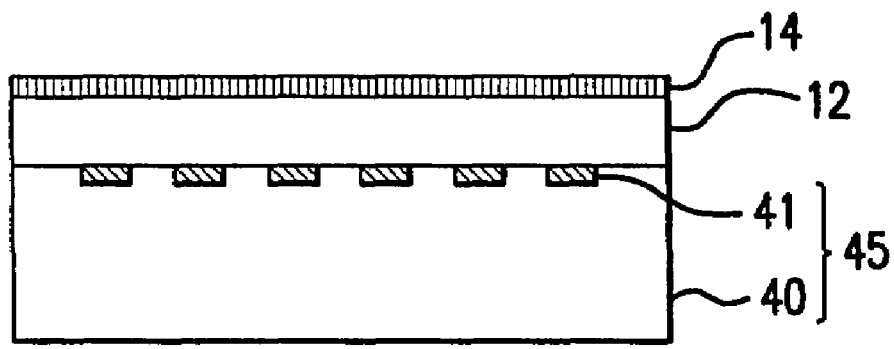
FIGS. 6A. 6B, and 6C illustrate a method for forming an optical upconversion layer as part of an optical imaging system, for example, in accordance with one specific application of the present invention.
Figure 6B:
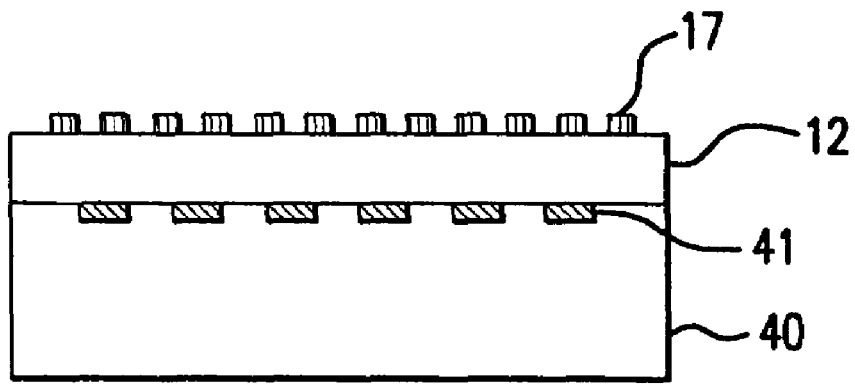
Figure 6C:
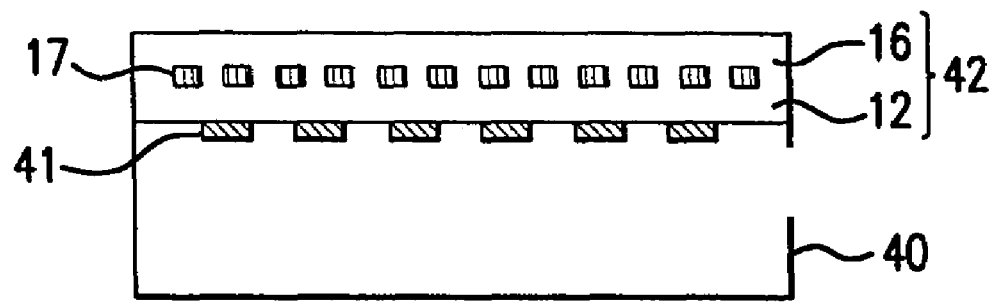

In FIG. 6A, a semiconductor substrate 40 has conventional, CMOS, visible light imaging elements 41 formed thereon. Once formed, this CMOS imager 45 is overlaid by an upconversion layer 42. This upconversion layer may be formed using any one of the methods described above.

However, as shown in FIG. 6A, a matrix material layer 12 is formed on CMOS imager 45, and a particle layer 14 is formed on matrix material layer 12. In FIG. 6B, mesoscopic, crystalline silicon particles 17 are formed from particle layer 14. Once fully embedded between layers 12 and 16 of the mesoscopic crystalline silicon particles are ready to up-convert incident IR radiation into visible light using optical pumping energy applied to upconversion layer 42.

Figure 7:
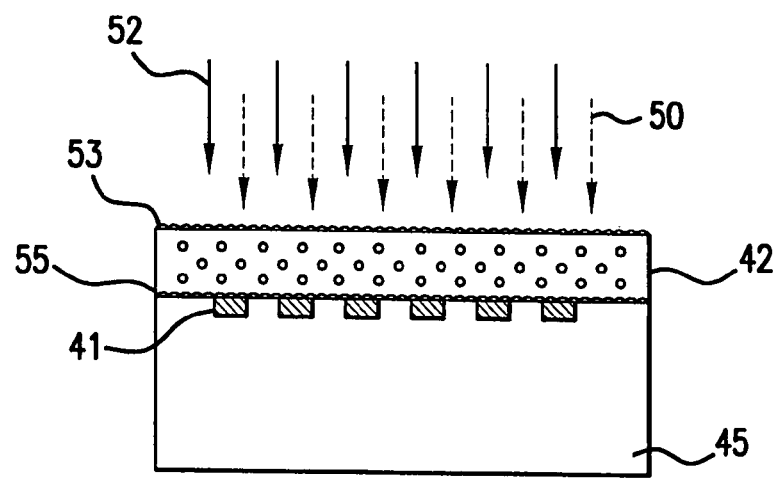
FIG. 7 further illustrates the combination of the upconversion layer of FIGS. 6A-6C with a conventional CMOS imager.

FIG. 7 further illustrates the combination of an upconversion layer 42 with CMOS imager 45. Incident IR radiation 52 impacts upconversion layer 42 through an (optionally provided) first optical filter 53 (e.g., band-pass, band-stop, high or low pass). First optical filter 53 may be conventional in nature and may be used, for example, to selected a range of IR frequencies to be imaged. A second optical filter 55 (related or unrelated to filter 53) may be optionally provided to optically segregate upconversion layer 42 from CMOS imager 45. For example, second optical filter 55 may prevent the optical pumping wavelength(s) from impacting CMOS imager 45. Alternatively and/or in conjunction with such wavelength selective filtering, first and second filters 53 and 55 may be cooperative reflective layers implementing a waveguide for pumping upconversion layer 42.

Figure 8:
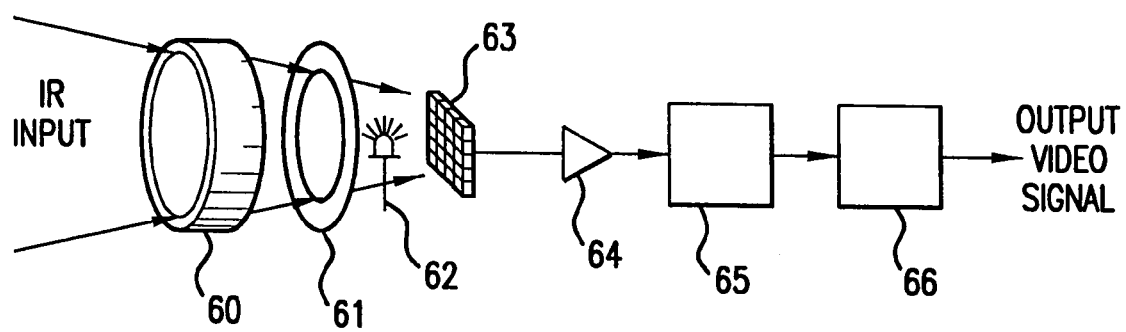
FIG. 8 illustrates an exemplary IR imaging system adapted to the incorporation of an optical upconversion layer according to the present invention.

FIG. 8 shows an exemplary IR imaging system adapted to the present invention. A conventional optics subsystem 60 and iris 61 gather and focus infrared radiation from a selected field-of-view. The IR radiation may be passed through a wavelength selective filter (not shown) before impacting a focal plane array (FPA) 63 formed in accordance with the example explained in relation to FIGS. 6A-6C. A optical pumping source 62 provides optical pumping energy to FPA 63. The IR radiation impacting FPA 63 is converted (and optionally amplified) from IR wavelengths to visible light wavelengths by a constituent upconversion layer using the optical energy provided by pumping source 62. The resulting visible light emissions are imaged using a conventional CMOS imaging circuit, a charge coupled device (CCD) imager, a two-dimensional array of silicon photodiodes or photo-conductors, or a silicon readout chip (hereafter, generically referred to a "conventional visible light imaging circuit." Thus, according to one aspect of the present invention, a FPA may be considered the integrated combination of a conventional visible light imaging circuit and an upconversion layer formed by mesoscopic particles embedded in a matrix of wide band-gap material.

Visible image signals from the visible light imaging circuit of FPA 63 are subsequently passed to amplifier(s) 64, analog-to-digital converter(s) 65, and a digital processor 66. A conventional RS 170 video signal, for example, may be readily derived as an output signal from this IR imaging system. As needed, a conventional array address generator and array bias circuit (not shown) may be incorporated within the IR imaging system of FIG. 8.

The present invention allows true optical tune-ability across a broad range of frequencies. This ability arises in part from the unique, continuous nature of the excited electron spectrum developed within an upconversion layer formed according to the present invention. As noted above, the limited, discrete number of energy states for excited electrons, as defined by conventional nano-sized particle structures, ensure that such conventional systems are restricted to one or more fairly narrow detection frequencies. However, the broad, multi-carrier, nearly continuous spectrum of energy states for excited electrons developed by the present invention allow broad optical tuning over a range of IR frequencies.

For example, a tunable laser or laser diode may be used as an optical energy pumping source. As the laser is tuned across its optical range, the changing wavelength of the pumping energy "selects" a different IR radiation frequency (or relatively narrow band of frequencies) from the spectrum of IR radiation frequencies focused upon a FPA formed in accordance with the present invention. Alternatively, the combination of a wide-band optical pumping source and tunable filter/optics may be used to applied uniform pumping illumination to the upconversion layer. Multiple, discrete optical sources may actuated to respectively select specific IR frequencies for imaging.

The selection of an optical pumping source and its arrangement within the IR imaging system is a matter of design choice and depends upon the number and range of IR frequencies to be imaged. However, unlike conventional IR imaging systems, the present invention is not locked into one or two discrete IR frequencies. Rather, the entire first and second thermal imaging bands may be swept by a tunable, optical pumping source to derive a complete set of IR imaging data. Alternatively, a collection of "signature" IR frequencies may be rapidly scanned by one or more optical pumping sources to identify a certain type of target.

The benefits, use and making of the present invention have been described in relation to relatively simple examples. While these examples are sufficient enabling disclosure, those of ordinary skill in the art will recognize that numerous modifications and adaptations are possible within the context of the present invention.

For example, increased efficiency in the radiative re-combination of electron/hole airs may be achieved by the controlled introduction of impurities into the matrix material of the upconversion layer. The introduction of such impurities tends to advantageously localize the electron and hole. Rare earth impurities, carbon complexes, and sulfur-oxygen complexes, as examples, may serve as localization centers for electron/hole re-combinations. While extrinsic luminescence in silicon can arise from a variety of sources, isoelectronic and rare-earth extrinsic centers are presently preferred.

Isoelectronic centers are created by doping Si with electrically neutral impurities such as the isovalent elements C, GE, and Sn or a multiple-atom complex without dangling bonds. Isoelectronic impurities bind free excitons in Si, which can increase the probability of electron/hole re-combinations due to spatial confinement of the particles.

Optical properties of rare-earth ions in solids have been investigated in great detail and are well understood. Optical emissions of erbium ions is of particular interest for semiconductor device applications. The excitation of erbium ions is a complicated process involving first electron/hole generation in Si, then exciton formation, and finally erbium excitation. Excited state relaxation then occurs via photon emission. Improved performance may be had by the introduction of an oxygen co-dopant.

Looking at the present invention from yet another aspect, a novel method for the creation of a unique distribution (or spectrum) of hot electrons can be seen. Under the influence of optical pumping energy, the embedded mesoscopic particles create within a wide band-gap matrix material, a stable (or steady-state), non-equilibrium, distribution of hot electrons. The distribution can be viewed as delta-like or a narrowly focused columnar distribution of hot electrons formed in relation to a tunable, optical energy pumping source. While preferably achieved by silicon particles embedded within a silicon dioxide matrix, the invention is not limited to these specific materials. Rather, any combination of materials capable of developing this distribution of hot electrons is susceptible to the present invention.

Several additional examples of the present invention will now be described as additional teaching embodiments. The first example illustrates application of the invention in the photon energy up-conversion of IR and near-IR optical signals. More particularly, photo-induced free carriers IR absorption and IR induced near-IR luminescence is accomplished using a composite structure formed from mesoscopic sized, crystalline silicon particles embedded within a layer of hydrogenated amorphous silicon ($\alpha$–Si:H).

Samples of this exemplary composite structure were formed by depositing a 500 Å thick layer of intrinsic $\alpha$–Si:H on a double sided, polished silicon substrate at a temperature of 350° C. The substrate was then subjected to a PECVD process using a hydrogen dilution ratio, $H_2$: $SiH_4$, of three to one and a flow rate of 50 sccm. Deposition chamber pressure was held at 50 mTorr and an RF power of 150 W was applied. The second and third examples described below more particularly set forth method steps by which the mesoscopic particles are formed within a surrounding material.

Figure 9:
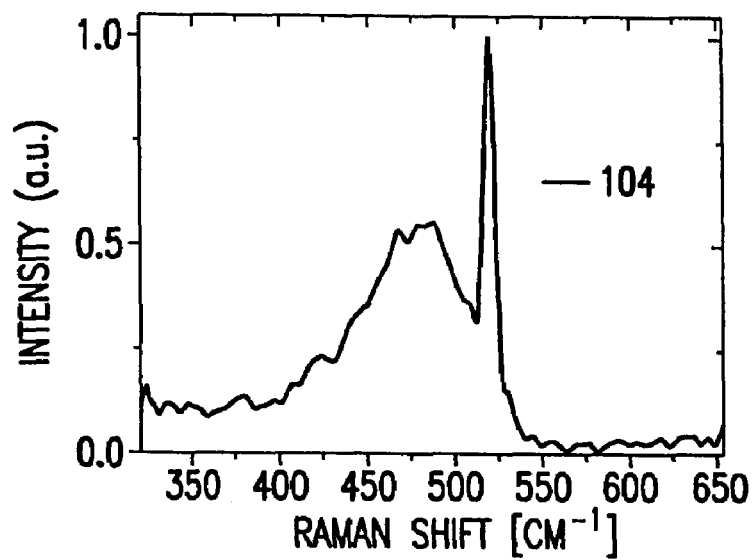
FIGS. 9, 10, 12 and 13 are graphical data derived from an experiment showing selected characteristics of a sample composite structure.

However, within the context of the first example, the size of the mesoscopic particles and the corresponding crystalline silicon volume fraction were determined by examination of a Raman spectra derived from the exemplary composite structure. The resulting Raman spectra is shown in graphical form in FIG. 9. The Raman spectra of FIG. 9 consists of two bands: (1) a narrow crystalline band appearing near 520 cm-1 and attributable to the silicon mesoscopic particles, and (2) a wide band Transverse Optical (TO) mode peaked at 480 cm-1 and attributable to the amorphous silicon.

The average size of the crystalline silicon mesoscopic particles was extracted from an empirical calibration curve describing the dependence of the Raman shift of the peak associated with the narrow crystalline band at 520 cm-1 in relation to the peak inherent for mono-crystalline silicon. The average diameter of the particles was determined to be around 14 nm. The volume fraction, $X_C$, of the crystalline silicon in the amorphous silicon layer was estimated according to the following relationship:

$$X_C = I_C/(I_C + I_A)$$

where $I_C$ and $I_A$ are the integrated intensities of the crystalline and amorphous peaks respectively. For investigated first sample, $X_C$ was determined to be only around 10%. Thus, the first sample composite structure is characterized by relatively small mesoscopic sized crystalline particles having a very low density.

As presently contemplated in one embodiment of the invention, preferred mesoscopic particle size ranges from 50 to 200 nm, and a preferred volume fraction for the crystalline silicon ranges from 50 to 60%. Nonetheless, even with particles sized near the low end of the mesoscopic range and a volume fraction near the expected low end of the volume fraction range, the resulting composite structure yielded good results when tested as a light converter. More compelling than the optical up-conversion capabilities observed, the first sample composite structure, exhibits such negligible quantum size effects that its behavior can rightfully be said to classical in nature.

Figure 10:
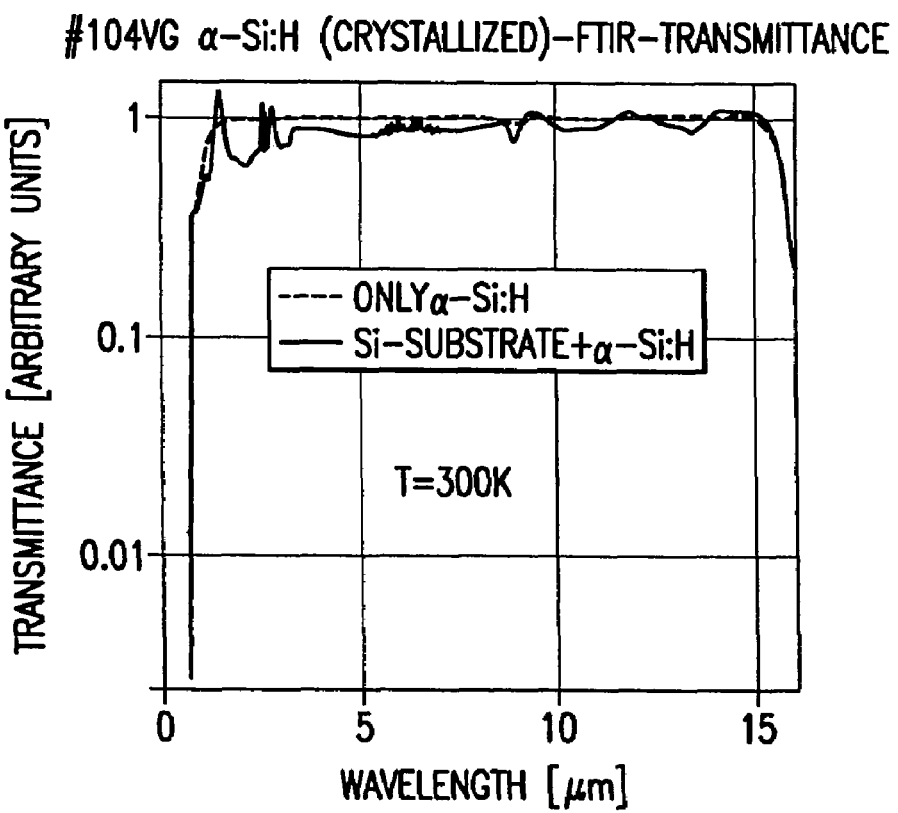

The IR transmittance spectrum for the first example composite structure was measured using a Bruker Equinox® 50 FTIR spectrometer working in standard fast scan mode. The measured transmittance spectrum for the first example composite structure is shown by the solid line in FIG. 10, as compared with the dashed line that shows an expected transmittance spectrum form the amorphous silicon alone.

Air transmittance was taken as a reference for the measurement of the transparency of the silicon substrate together with amorphous silicon layer. In order to get intrinsic transmittance of hydrogenated amorphous silicon layer, the measured spectrum was divided by the transmittance spectrum of the silicon substrate and measured relative to that of air. From the foregoing, it is clear that little, if any, measurable absorption occurs in the first sample composite structure across a range of optical IR wavelengths from 1 to 16 μm.

Photo induced absorption (PIA) and IR induced photoluminescence measurements were taken in relation to the first sample composite structure. Pumping light with the energy of photons $E_{Ph}^P = 1.6$ eV($\lambda^P = 775$ nm) larger than the crystalline silicon bandgap, $E_g^{Si} = 1.12$ eV, but less than the α-Si:H bandgap, $E_g^{\alpha-Si:H} = 1.75$ eV, is absorbed in the mesoscopic sized regions of the composite structure (here, a "layer") providing photo-induced SNED of free holes in these regions. Being normally almost 100% transparent to IR wavelengths in the absence of pumping light, the crystalline silicon regions become more opaque (less transparent) with the application of pumping light and a photo-induced SNED of free holes is established.

Pumping light induced absorption (PIA) of IR radiation leads to a reduction of the composite layer's integral (i.e., the combined mesoscopic sized regions plus surrounding α-Si:H) transmittance. This absolute reduction in transmittance, ΔT, is a measure of the PIA. The existence of the PIA directly proves the existence of a photo-induced SNED of free carriers (i.e., holes in the working example).

If the energy of absorbed IR photons is sufficiently large to generate these hot free carriers from the photo-induced SNED above the energetic barrier between the crystalline silicon mesoscopic regions and the surrounding amorphous silicon matrix, then the holes overcome the barrier and penetrate to the surrounding matrix and there recombine radiatively. The IR induced luminescence is observed as increasing transmittance near a specific wavelength, $\lambda_{IR}^{LUM}$, in the Near IR spectral range. This specific wavelength is defined as $\lambda_{IR}^{LUM} \approx hc/(E_c^{\alpha-Si:H} - E_{RRC})$, where h is the Planck constant, c is the light velocity, $E_c^{\alpha-Si:H}$ is the bottom of α-Si:H conductivity band and $E_{RRC}$ is the energy of radiative recombination center in the surrounding amorphous silicon matrix. A positive change in transmittance within this spectral range is interpreted as IR induced luminescence.

Indeed, given the configuration of the experimental setup described herein, transmittance of the composite structure is always measured. A probe IR light source illuminates the investigated composite structure, the IR cooled MCT detector is placed after the sample and measures how much IR light passes through the sample to determine IR transmittance. The detector's signal is a photo-voltage measured in Volts, where the larger the transmittance the greater the output signal voltage. The intensity of the pumping source is mechanically chopped (open/close) in accordance with a defined frequency. The lock-in amplifier connected to the output of MCT detector measures the change of transmittance $\Delta T = T_{pump} - T_o$, (pump opened-pump closed) and it sign at chopper's frequency. PIA is characterized by negative change in transmittance ($\Delta T < 0$) and IR induced luminescence by the positive change ($\Delta T > 0$).

Figure 11:
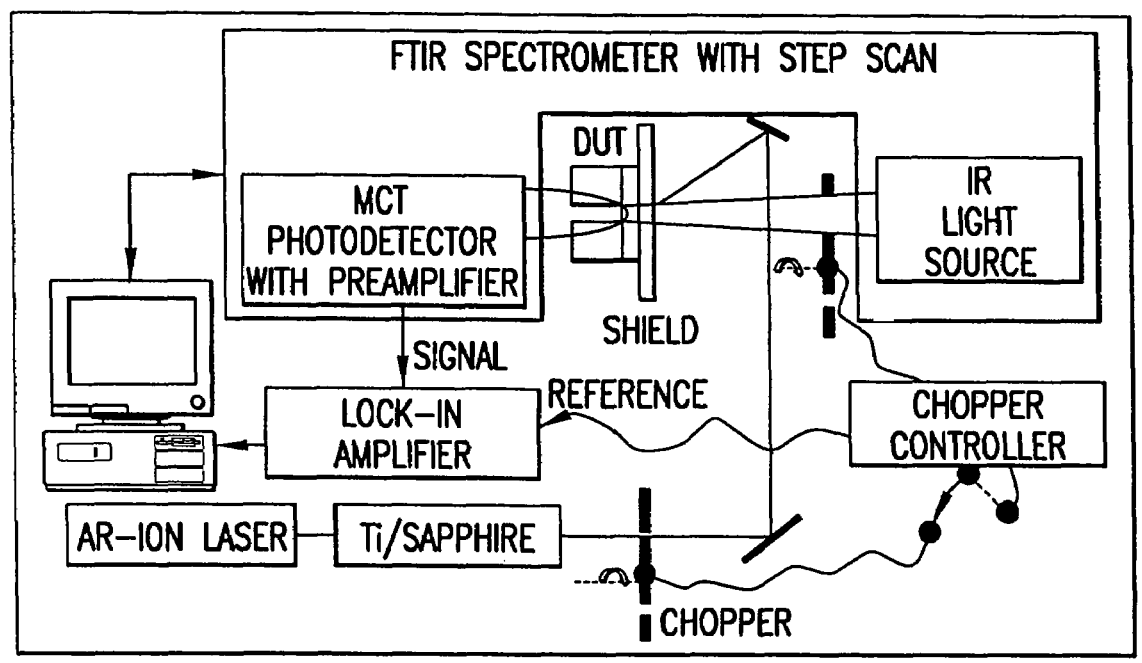
FIG. 11 illustrates in block diagram form the experimental set-up used to derive the data shown in FIGS. 9, 10, 12 and 13.

The experimental setup shown in FIG. 11 was used to make these measurements. In more detail, a Ti-sapphire laser 70 (COHERENT—899 RING laser 10 mM at 775 nm) was used as an optical pumping source to produce non-equilibrium free carriers within the mesoscopic sized crystalline silicon particles of the first sample composite structure. The Ti-sapphire laser 70 was exited by an Argon-ion laser 71 (COHERENT-INNOVA (70÷400)mW at 488 nm). The change in optical transmission performance was measured using a Bruker Equinox 55 Step-Scan FTIR spectrometer 72 and a SR830 LOCK-IN amplifier 73. A range of wavelengths extending from 0.65 μm to 16 μm was covered by use of HgCdTe photovoltaic detector 74, cooled by liquid nitrogen.

The experiment were performed using a pump and probe approach. The Ti-sapphire laser at a wavelength of 775 nm was chosen as pumping light source for excitation of photo carriers within the mesoscopic sized crystalline silicon particles, but not within the surrounding amorphous silicon layer. Expressed as related voltages, $E_g^{Si}(1.1$ eV$) \leq E_{Ph}(1.6$ eV$) < E_g^{\alpha-Si:H}(1.75$ eV$)$ The laser light was mechanically chopped using a controlled chopper 75, and the photo induced absorption (PIA) signal was measured by lock-in amplifier 73 referenced at the chopper frequency. IR light from the FTIR spectrometer working in step-scan mode was used as a probe the first sample composite structure. Measurements were performed at room temperature.

Figure 12:
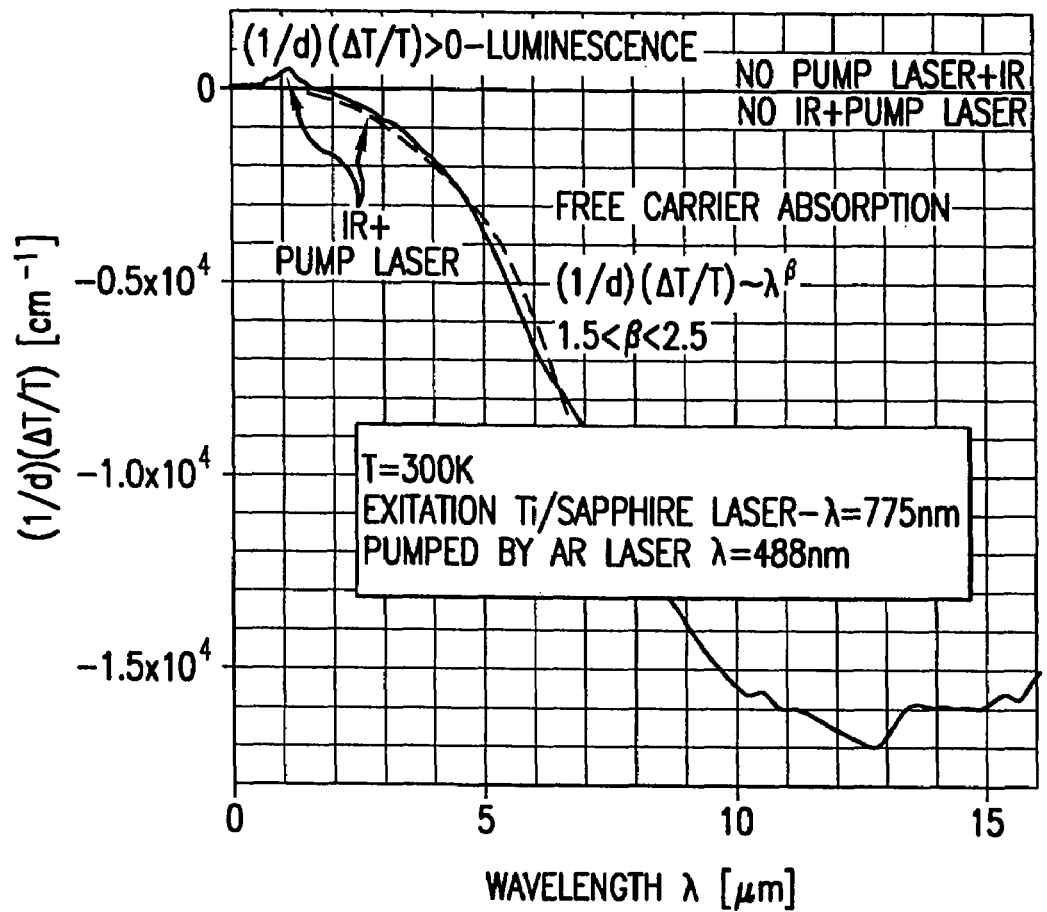

The result of pump-probe experiment of FIG. 11 is shown in FIG. 12. The vertical axis shown in FIG. 12 reflects the relative change in transmittance of the composite structure, $\Delta T/T_o = (T_{pump} - T_o)/T_o$, and is normalized to the diameter of the mesoscopic region d transmission. This is convenient representation of the experimental results because it provides the absorption coefficient for the investigated composite structure, $\alpha = -(1/d)(\Delta T/T_o)[cm^{-1}]$, more exactly than the absorption coefficient of mesoscopic sized regions. The horizontal axis of the graph in FIG. 12 shows wavelength of the probe IR source, $\lambda_{IR\_probe}$, where pumping source is a monochromatic Ti-Sapphire laser having a wavelength of $\lambda_{Pump} = 775$ nm.

In wavelength range, where $(1/d)(\Delta T/T_o)$ is negative, the absorption coefficient is α>0-PIA-wide spectral band 2 μm÷16 μm. That is, the long wavelength cut-off is defined by the limit of sensitivity in the experimental setup given the particular MCT detector. The onset of the band near at 2 μm up to approximately 6-7 μm may be fit to the graphical plot by the following function: $\alpha=-(1/d)(\Delta T/T_o)=f(\lambda_{IR\_probe})\sim(\lambda_{IR\_probe})^\beta$. Best fit is achieved for the constant coefficients β ranging between (1.5<β<2.5). Such power exponent dependence of absorption coefficient is typical for the so-called free carrier absorption. Therefore, the observed results are an experimental validation of the absorption of IR radiation by free carriers from a photo-induced SNED.

In the Near IR spectral range, from ~0.7 μm up to 2 μm, the spectral dependence of $\Delta T/T_o=(T_{pump}-T_o)/T_o$ is positive, and α is negative. The negative absorption coefficient is commonly treated in laser society as the requirement for optical gain in the lasing media and related stimulated emission. In our case the negative absorption coefficient is associated with the spontaneous radiative recombination of IR induced luminescence.

Figure 13:
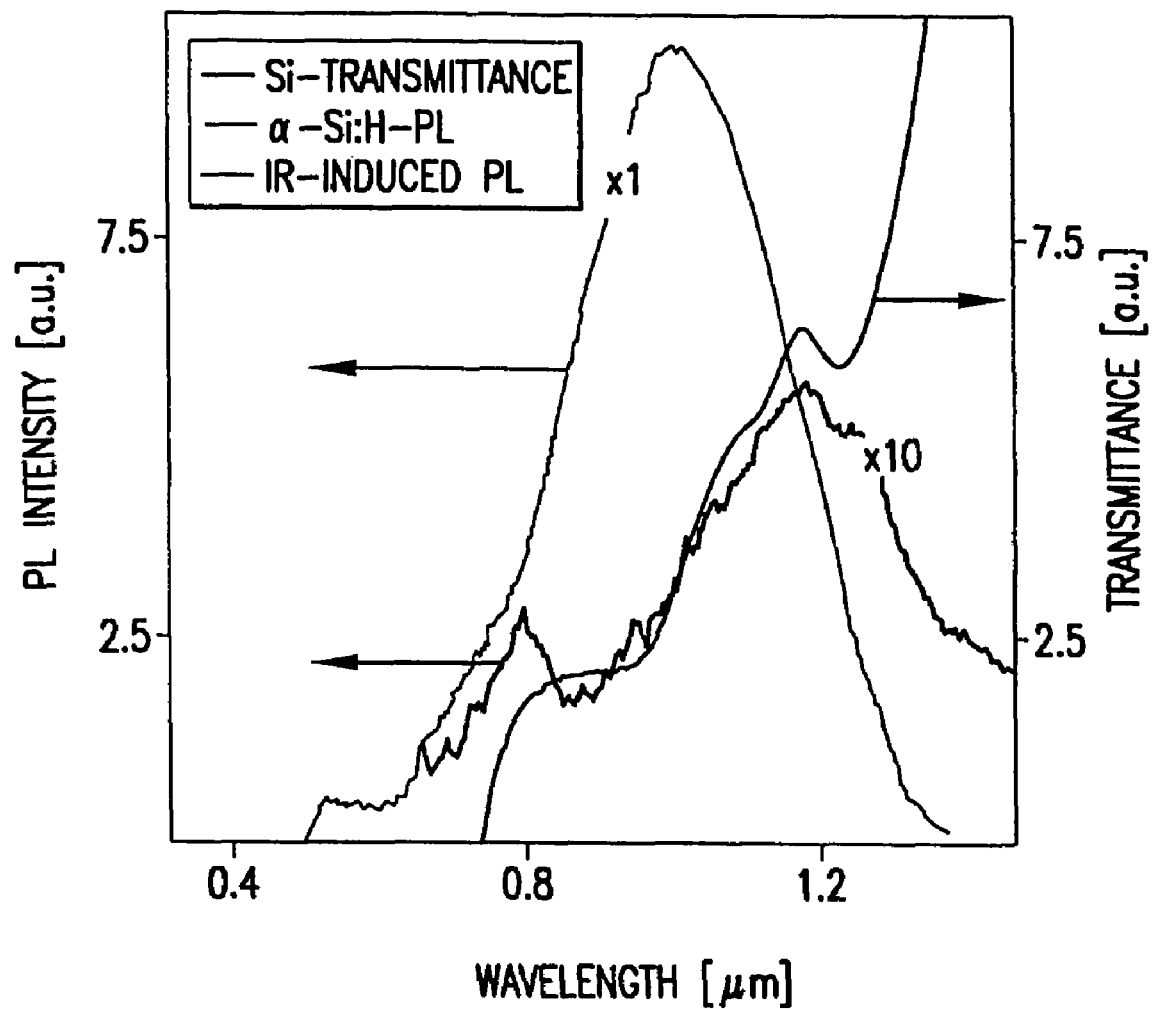

In order to determine whether this luminescence band was IR induced and not a photoluminescence effect resulting from laser excitation, measurements were performed using a chopped IR source while the Ti/Sapphire laser operated in CW mode. The spectrum of IR induced luminescence was the same in both cases. The spectrum of IR induced luminescence measured in this specific configuration (i.e., through the composite structure substrate) is limited from the shot wavelength (1.12 μm) side by the transmittance of silicon substrate. The direct measurement of photoluminescence for the first sample composite structure shows a peak at 1 μm that corresponds to photon energy value of 1.2 eV The respective spectra for: (1) a reference silicon wafer transmittance, (2) a reference α–Si:H layer photoluminescence, and (3) the IR induced luminescence are shown collectively in FIG. 13.

The presence of IR induced luminescence suggests that recombination occurs within the α–Si:H matrix of the composite structure and not within the mesoscopic sized crystalline silicon particles. IR exited free carriers (actually holes rather than electrons in the case of amorphous silicon) penetrate into α–Si:H without recombination on the interface. By way of comparison, the same measurements were taken on single crystal silicon sample. The PIA signal for the single crystal silicon measurement was three orders of magnitude weaker, and no IR induced luminescence was observed. The wavelength dependence of PIA (not shown) was also power exponent law with the β=1.8 Photoluminescence for the sample α–Si:H layer without crystalline silicon particles was observed only when the argon-ion laser pumping source emitted photons more energetic than α–Si: H bandgap. i.e., ($E_{ph}$ (2.54 ev)>$E_g^{\alpha-Si:H}$(1.75 eV)). For this last case, very weak PIA (two orders of magnitude less than that associated with the first sample composite structure) in a spectral range between 1 μm and 4 μm was observed. Such narrow band-like PIA is associated with photo-exited free carriers trapped by localized states occurring in the hydrogenated amorphous silicon bandgap.

Several significant facts emerge from the foregoing examination of a first sample composite structure fabricated in accordance with the present invention. First, a steady state, non-equilibrium distribution of hot free carriers is created within mesoscopic sized silicon particles embedded in α–Si:H surrounding layer.

Second, these free carriers are well adapted to efficiently absorbed IR radiation (huge absorption coefficient α~104 cm-1) and subsequently emit near-IR light.

Third, the short wavelength onset of the IR absorption band is defined by a power exponent law for free carrier absorption and may be dynamically determined in accordance with the energy and intensity of a pumping light source.

Fourth, the free holes developed within the mesoscopic sized silicon particles that absorb IR photons are able to overcome potential energetic barriers without loss of energy due to thermal exhaustion and penetrate into a surrounding matrix material in order to radiatively recombinate.

Fifth, a coarse estimate of conversion efficiency is about one percent. This conversion efficiency value may be significantly improved by increasing the size and density of the silicon particles by combination of multiple composite structure layers, and also by creation within the surrounding layer of a significant additional number of potential radiative recombination centers. This may be accomplished by doping the surrounding material with rear earth atoms such as Yb.

Sixth, the present invention, as applied to at least a crystallized hydrogenated amorphous silicon composite structure may be used to form an IR to near-IR/visible light conversion layer.

The term "particles" has been used in the foregoing discussion of the composite structure to describe mesoscopic sized regions, or islands of one or more narrow band-gap materials. Silicon has been used thus far as an example of a narrow band-gap material, but other semiconductor materials, such as InAs, HgTe, Ge, or even metals, such as Al, and Cu might be used. The term "particles" should be broadly interpreted to describe regions and structures having various shapes. Indeed, the numerous fabrication processes adapted to the formation of mesoscopic sized particles will inherently create particles of varying shape and constitution. Further, the term "embedded" has been used to describe the relationship between the mesoscopic sized particles and the surrounding wide-bandgap material (whether such material is "layer" is form or otherwise). Silicon dioxide has been suggested in the foregoing examples as a convenient surrounding material, but any competent matrix of wide band-gap material or dielectric material, such as SiO2, Si3N4, AlAs, GaSb, CdTe, and/or ZnS might be used. The term "embedded" should also be broadly construed to cover any arrangement of narrow band-gap and wide band-gap materials having significant surface contact. Complete "surrounding" of the mesoscopic sized particles by a wide-bandgap material within a composite structure, while presently preferred, is not required.

An exemplary process, well adapted to the formation of a competent composite structure, is illustrated in relation to FIGS. 14A through 14E. That is, an optical converter layer (a specific composite structure) in accordance with the present invention may readily be formed using conventional fabrication techniques applied to Silicon-On-Insulator (SOI) wafer.

To begin, a SOI wafer, for example a six-inch SOI wafer from SiGen Corporation, is selected with a flatness to 0.1 micron and roughness of 0.06 nanometer. Many conventional processes are applicable to the cleaning of the wafer's surface. For example, the wafer may first be treated with dichloromethane, acetone, methanol, and de-ionized water. Then the wafer is treated with an SC1 mixture of aqueous ammonia, hydrogen peroxide, and water. Following a rinse in de-ionized water, the wafer is etched with diluted or buffered HF acid.

Figure 14A:
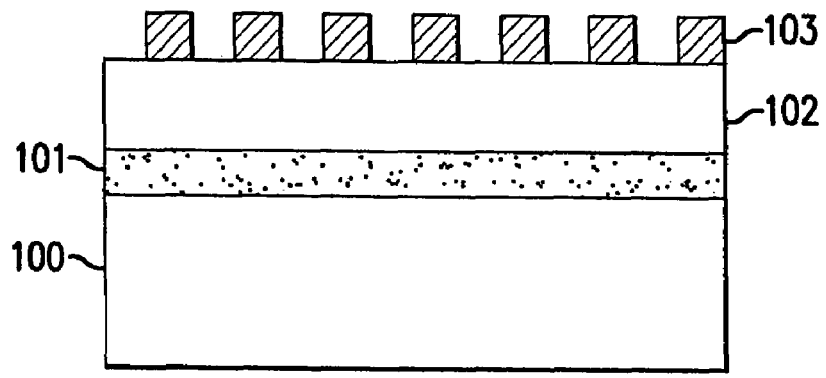
FIGS. 14A through 14E illustrate another exemplary method whereby a composite structure according to the present invention may be formed; and, FIGS. 15A, 15B, and 15C illustrate yet another exemplary method whereby a composite structure according to the present invention may be formed.

The cleaned SOI wafer is illustrated in FIG. 14A as a silicon substrate 100 separated by a SiO2 interlayer 101 from silicon layer 102. Following formation of a thin, protective SiO2 layer (preferably 1000 Å thick) in an oxidation furnace, a patterned polymer layer 103 is formed over silicon layer 102 using nano-imprint lithography technique.

Figure 14B:
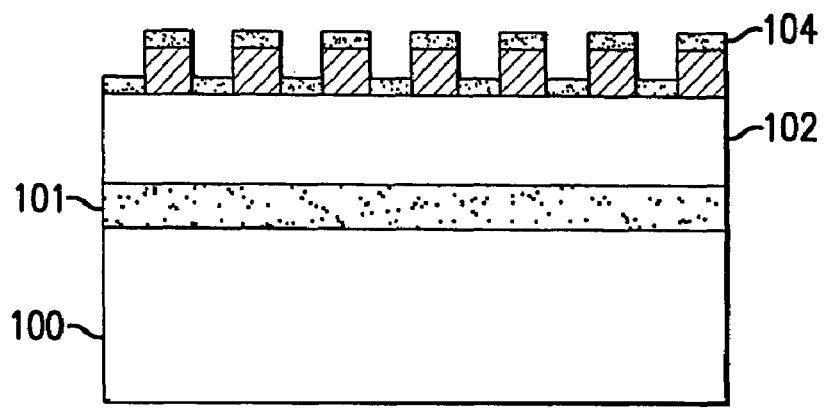
Figure 14C:
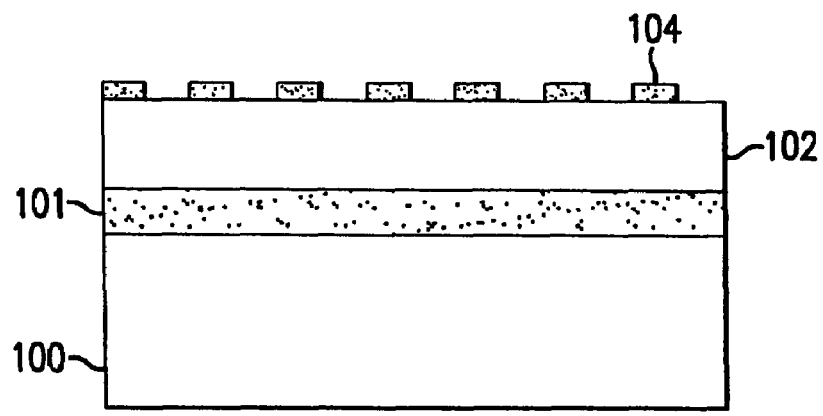
Figure 14D:
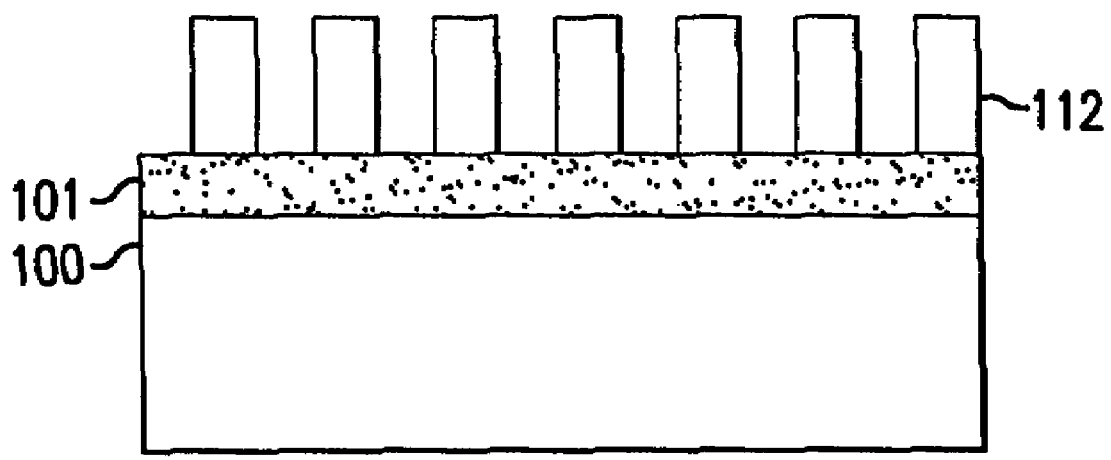

As shown in FIGS. 14B and 14C, a chromium layer 104 is deposited over the surface of the resulting structure. Thereafter, a precisely formed chromium mask is fabricated on silicon layer 102 with a conventional lift-off process.

Using any one of the available, conventional isotropic dry etching techniques, unmasked areas of the silicon layer 102 are etched down up to SiO2 layer to produce mesoscopic sized silicon pillars 112, preferably ranging in diameter from 50 nm to 200 nm with a pitch between 100 to 300 nm correspondently. See, FIG. 14D. The height of all pillars is defined by thickness of silicon layer 102 that is preferably equal to pillars diameter. For example, unmasked areas of the silicon layer 102 may be etched down to form the mesoscopic sized silicon pillars using an RIE process utilizing am CF4 or SF4 plasma. Once the silicon pillars 112 are formed, the chromium mask is removed, and the protective SiO2 layer is etched using a plasma of C2F6:CHF3.

Figure 14E:
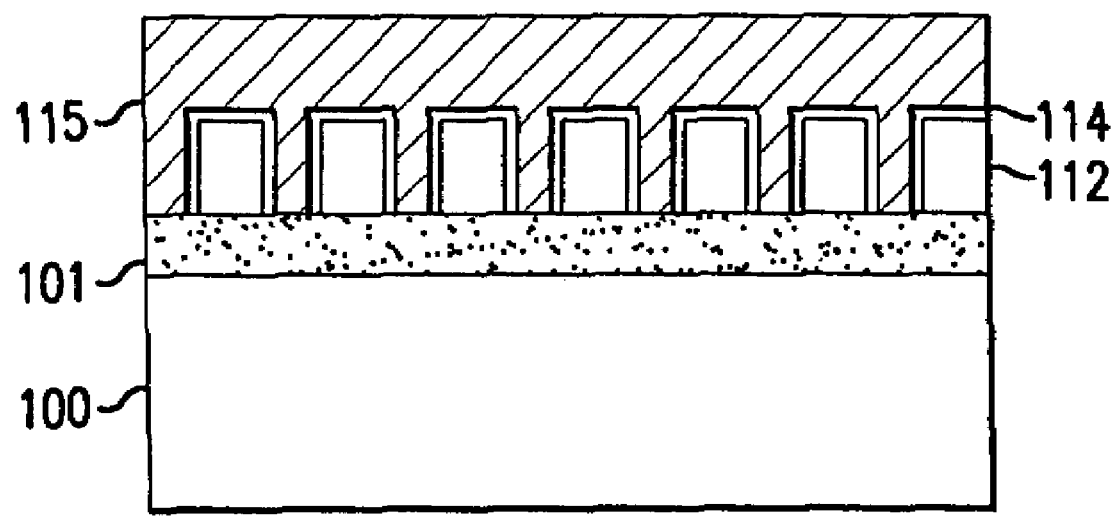

Following another surface cleaning, a high quality interface (Si/SiO2) layer 114 is (preferably less than 100 Å in thickness) formed by means of a thermal oxidation process. That is, as presently preferred, a 20 to 30 Å thick silicon oxide layer is formed over the exposed surfaces of the mesoscopic sized silicon pillars in a nitrogen rich atmosphere. Typical oxidation times run between 20 and 30 minutes. This gate quality SiO2 layer should be uniform to 2.5 to 3% across the wafer. As shown in FIG. 14E, following formation of the high quality (Si/SiO2) interface layer, a doped SiO2 layer 115 is formed and covers the passivated silicon pillars (112/114). This layer may be formed, for example, by means of a sputtering process performed using an Ar plasma in conjunction with an SiO2/Yb2O3 target. A Yb-doped SiO2 layer of 1.5 to 2 microns thickness is presently preferred. Other techniques may be used to form a competent composite structure.

Figure 15A:
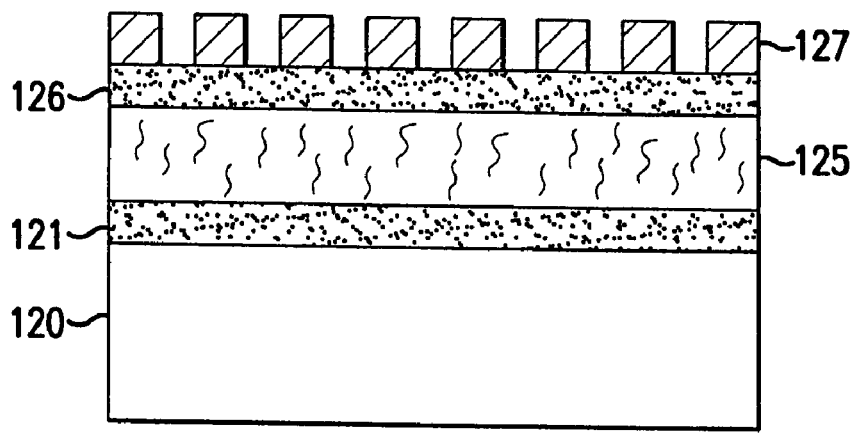
Figure 15B:
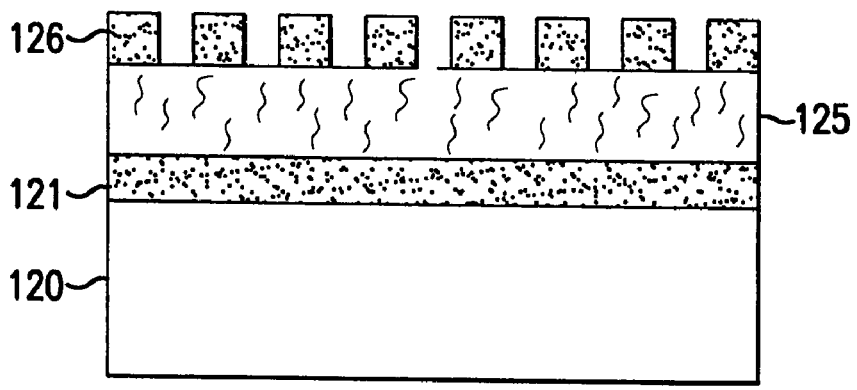
Figure 15C:
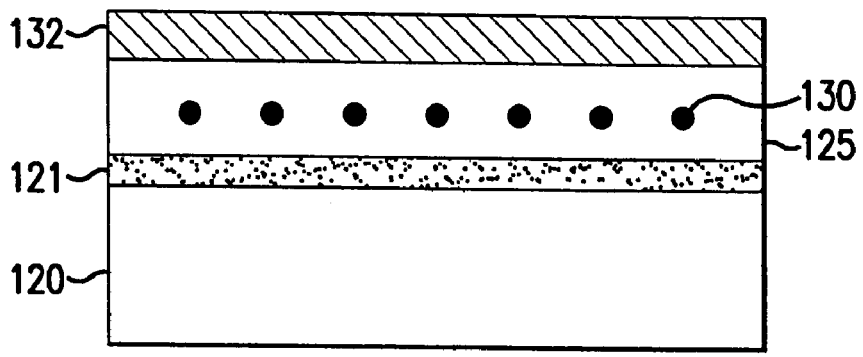

The second exemplary method adapted to the formation of a composite structure is illustrated in FIGS. 15A through 15C. Here, the composite structure is formed by mesoscopic sized crystalline silicon particles embedded within the matrix of α-Si:H and to cover it with a relatively thick layer of ytterbium-doped silicon dioxide. Preferably, the crystalline silicon particles will be formed in a size range extending from 50 to 200 nm with a pitch between 100 to 300 nm correspondently. The size may be controlled by adjusting the annealing time discussed below.

Referring to FIGS. 15A-15C, the exemplary fabrication process begins with a silicon wafer 120 having 0.1 micron flatness and 0.06 nanometer maximum roughness. The wafer is surface cleaned as discussed above. Thereafter, a SiO2 layer 121 of 1000 Å thickness is formed by a conventional thermal oxidation process.

A 100 to 200 nm thick α-Si:H layer 125 is then deposited using, for example, a HWCVD or PECVD process. The presently preferred PECVD deposition process includes use of H2/SiH4 (H2-0-20%) at a pressure ranging between 100 and 500 mTorr, a substrate temperature ranging between 200 and 350° C., and an RF power of 0.02 W/cm2.

Another SiO2 layer 126 (preferably 50 to 100 nm in thickness) is deposited over α-Si:H layer 125 using, for example, a CVD process. Within the preferred process, N2O/SiH4 (up to 1:5) is applied at a pressure ranging between 50 to 100 mTorr to a substrate held at a temperature ranging between 200 to 350° C. with an RF power between 150 and 200 W. Alternatively, SiO2 layer 126 may be deposited over α-Si:H layer 125 using an e-beam evaporation process.

The SiO2 layer 126 is ultimately used as a patterned film through which a hydrogen plasma treatment is applied to α-Si:H layer 125. To form SiO2 layer 126 into an appropriately patterned film, a polymer layer 127 is first formed over SiO2 layer 126 and then patterned using imprint lithography technique. Using the patterned polymer layer 127, SiO2 layer 126 is etched using, for example, an RIE process (e.g., a plasma of C2F6:CHF3 (1:1)). thereafter the patterned polymer layer 127 is removed using a oxygen plasma etch. See, FIG. 15B.

Following a surface cleaning of the resulting structure using H2SO4:H2O2(4:1)+NH4OH or SC1 and buffered HF, the crystalline silicon particles 130 are formed in α-Si:H layer 125. A nucleation process is presently preferred in which α-Si:H layer 125 is exposed to hydrogen plasma using an RIE/ECR system with a substrate temperature of 300K, a pressure of 10 to 50 mTorr and a plasma inducing DC bias of between 20 to 50V for 15 to 30 minutes. Thereafter the crystalline silicon particles are selectively grown from the nucleuses in the plasma treated (unmasked) areas by low-temperature annealing of the resulting structure in a N2 atmosphere at a temperature up to 600° C. for 20 to 50 minutes.

After mesoscopic sized particles are formed, the patterned SiO2 layer 126 is stripped using a diluted hydrofluoric acid solution.

Finally, as shown in FIG. 15C, a Yb-doped α-Si:H layer 130 is formed, as described above, over the α-Si:H layer 125 comprising the crystalline silicon particles 130.

In a related aspect, an interferential filter may be deposited over the upper surface of either one of the foregoing exemplary composite structures. This type of filter, or a similar structure, is typically required where the composite structure is used within an IR to near-IR or visible light converter combined with a CMOS imager. Otherwise, the pumping light applied to the composite structure will penetrate the CMOS imager.

An interferential filter may be formed, for example, by means of alternating SiO2/Si3N4 layers formed using conventional techniques. Three to five alternating layers having a width ~(λvis/4)≈250 nm are presently preferred.

The present invention has been taught in the context of selected embodiments. The composition and fabrication of the specialized media, as well as its use within selected applications, is the subject of considerable design variations and adaptations. The foregoing examples are used to teach the making and use of the present invention are do not limit the scope the invention which is set forth in the attached claims.

What is claimed is:

1. An apparatus for conversion of radiation comprising:
    a mesoscopic sized region;
    an interface surrounding the mesoscopic sized region and contacting the mesoscopic region to form an energetic barrier sufficient to spatially confine free carriers in the mesoscopic sized region; and
    a matrix material surrounding the interface,
    wherein at least one of the interface and the matrix material provides radiative recombination of the free carriers.

2. The apparatus of claim 1, wherein the free carriers are photo-induced by Infrared or near-Infrared light contained in the radiation and incident upon the mesoscopic sized region.

3. The apparatus of claim 2, further comprising:
    an optical source generating pumping energy further inducing the free carriers.

4. The apparatus of claim 3, wherein the optical source is a tunable.

5. The apparatus of claim 3, wherein the matrix material and the interface are substantially transparent to the pumping energy.

6. The apparatus of claim 1, wherein the interface is formed solely by the matrix material surrounding the mesoscopic sized region.

7. The apparatus of claim 1, wherein the matrix material comprises a wide band-gap material.

8. The apparatus of claim 1, wherein the matrix material consists essentially of a wide band-gap material.

9. The apparatus of claim 1, wherein the mesoscopic sized region is formed from crystalline silicon and the matrix material is formed from silicon dioxide.

10. The apparatus of claim 2, wherein the mesoscopic sized region has a largest dimension greater than a propagation wavelength of the photo-induced free carriers but less than a scattering free path for the photo-induced free carriers.

11. The apparatus of claim 2, wherein the spatially confined photo-induced free carriers have an energy state such that impact by photons of a predetermined band with the free carriers causes the free carriers to traverse the energetic barrier.

12. The apparatus of claim 11, wherein one or more interface states between the mesoscopic sized region and the matrix material are formed substantially without the presence of intervening unoccupied interface states.

13. The apparatus of claim 1, wherein the mesoscopic sized region is formed from a silicon based material layer.

14. The apparatus of claim 1, wherein the matrix material is doped with at least one of a rare earth element and an isovalent element.

* * * * *